US012087741B2

(12) United States Patent
Kusunoki et al.

(10) Patent No.: US 12,087,741 B2
(45) Date of Patent: Sep. 10, 2024

(54) DISPLAY DEVICE

(71) Applicant: SEMICONDUCTOR ENERGY LABORATORY CO., LTD., Atsugi (JP)

(72) Inventors: Koji Kusunoki, Kanagawa (JP); Yosuke Tsukamoto, Kanagawa (JP); Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/055,206

(22) PCT Filed: May 8, 2019

(86) PCT No.: PCT/IB2019/053758
§ 371 (c)(1),
(2) Date: Nov. 13, 2020

(87) PCT Pub. No.: WO2019/220267
PCT Pub. Date: Nov. 21, 2019

(65) Prior Publication Data
US 2021/0118855 A1    Apr. 22, 2021

(30) Foreign Application Priority Data
May 17, 2018    (JP) .................................. 2018-095670

(51) Int. Cl.
*H01L 25/075*    (2006.01)
*H01L 27/12*    (2006.01)
(Continued)

(52) U.S. Cl.
CPC ...... *H01L 25/0753* (2013.01); *H01L 27/1225* (2013.01); *H01L 29/78651* (2013.01);
(Continued)

(58) Field of Classification Search
CPC .......... H01L 27/1225; H01L 29/78651; H01L 27/7869; H01L 33/504; H01L 33/58;
(Continued)

(56) References Cited

U.S. PATENT DOCUMENTS 5,998,925 A    12/1999 Shimizu et al.
6,069,440 A    5/2000 Shimizu et al.
(Continued)

FOREIGN PATENT DOCUMENTS

CN    001495918 A    5/2004
CN    102163403 A    8/2011
(Continued)

OTHER PUBLICATIONS

International Search Report (Application No. PCT/IB2019/053758) dated Jul. 30, 2019.
(Continued)

*Primary Examiner* — Raj R Gupta
(74) *Attorney, Agent, or Firm* — Fish & Richardson P.C.

(57) ABSTRACT

A display device with a high luminance, a high contrast, and low power consumption is provided. The display device includes a transistor, a light-emitting element, a coloring layer, a phosphor layer, a first electrode, and a second electrode. The light-emitting element is electrically connected to the first electrode and the second electrode, the first electrode is electrically connected to the transistor, and the second electrode is positioned on the same plane as the first electrode. The coloring layer is positioned over the light-emitting element, the phosphor layer is positioned between the light-emitting element and the coloring layer, and the phosphor layer, the light-emitting element, and the coloring layer include a region in which they overlap with one another. The light-emitting element includes a light-emitting diode chip, and the phosphor layer has a function of emitting
(Continued)

light of a complementary color of an emission color of the light-emitting element.

17 Claims, 24 Drawing Sheets

(51) Int. Cl.
  *H01L 29/786* (2006.01)
  *H01L 33/50* (2010.01)
  *H01L 33/58* (2010.01)
  *H01L 33/62* (2010.01)
(52) U.S. Cl.
  CPC ........ *H01L 29/7869* (2013.01); *H01L 33/504* (2013.01); *H01L 33/58* (2013.01); *H01L 33/62* (2013.01); *H01L 2933/0041* (2013.01); *H01L 2933/0058* (2013.01); *H01L 2933/0066* (2013.01)
(58) Field of Classification Search
  CPC ... H01L 33/62; H01L 25/075; H01L 25/0753; H01L 25/167; H01L 2933/0066
  See application file for complete search history.

(56) References Cited

U.S. PATENT DOCUMENTS

| | | | |
|---|---|---|---|
| 6,608,332 B2 | 8/2003 | Shimizu et al. | |
| 6,614,179 B1 | 9/2003 | Shimizu et al. | |
| 7,026,756 B2 | 4/2006 | Shimizu et al. | |
| 7,071,616 B2 | 7/2006 | Shimizu et al. | |
| 7,126,274 B2 | 10/2006 | Shimizu et al. | |
| 7,215,074 B2 | 5/2007 | Shimizu et al. | |
| 7,329,988 B2 | 2/2008 | Shimizu et al. | |
| 7,362,048 B2 | 4/2008 | Shimizu et al. | |
| 7,531,960 B2 | 5/2009 | Shimizu et al. | |
| 7,682,848 B2 | 3/2010 | Shimizu et al. | |
| 7,855,092 B2 | 12/2010 | Shimizu et al. | |
| 7,901,959 B2 | 3/2011 | Shimizu et al. | |
| 7,915,631 B2 | 3/2011 | Shimizu et al. | |
| 7,943,941 B2 | 5/2011 | Shimizu et al. | |
| 7,968,866 B2 | 6/2011 | Shimizu et al. | |
| 7,969,090 B2 | 6/2011 | Shimizu et al. | |
| 8,148,177 B2 | 4/2012 | Shimizu et al. | |
| 8,309,375 B2 | 11/2012 | Shimizu et al. | |
| 8,610,147 B2 | 12/2013 | Shimizu et al. | |
| 8,679,866 B2 | 3/2014 | Shimizu et al. | |
| 8,685,762 B2 | 4/2014 | Shimizu et al. | |
| 8,754,428 B2 | 6/2014 | Shimizu et al. | |
| 9,130,130 B2 | 9/2015 | Shimizu et al. | |
| 9,153,171 B2 | 10/2015 | Sakariya et al. | |
| 9,626,908 B2 | 4/2017 | Sakariya et al. | |
| 9,954,177 B2 | 4/2018 | Ishisone et al. | |
| 9,959,815 B2 | 5/2018 | Sakariya et al. | |
| 10,380,952 B2 | 8/2019 | Sakariya et al. | |
| 10,453,759 B2 | 10/2019 | Iguchi | |
| 10,573,667 B2 | 2/2020 | Ikeda et al. | |
| 10,763,180 B2 | 9/2020 | Iguchi | |
| 10,796,648 B2 | 10/2020 | Sakariya et al. | |
| 10,811,611 B2 | 10/2020 | Ishisone et al. | |
| 10,971,410 B2 | 4/2021 | Iguchi | |
| 11,114,423 B2 | 9/2021 | Iguchi | |
| 2010/0117516 A1 | 5/2010 | Shimizu et al. | |
| 2010/0253710 A1 | 10/2010 | Rankov et al. | |
| 2012/0126234 A1 | 5/2012 | Yamazaki et al. | |
| 2012/0126723 A1 | 5/2012 | Seo | |
| 2012/0161116 A1 | 6/2012 | Aoyama et al. | |
| 2012/0217515 A1 | 8/2012 | Yamazaki et al. | |
| 2013/0069068 A1* | 3/2013 | Miyake | H01L 27/124 257/E27.12 |
| 2013/0082906 A1 | 4/2013 | Toyomura et al. | |
| 2014/0168037 A1 | 6/2014 | Sakariya et al. | |
| 2015/0138050 A1* | 5/2015 | Kim | H04N 13/341 345/76 |
| 2016/0013170 A1 | 1/2016 | Sakariya et al. | |
| 2016/0064424 A1 | 3/2016 | Umezaki | |
| 2016/0268513 A1 | 9/2016 | Ishisone. et al. | |
| 2017/0133550 A1 | 5/2017 | Schuele et al. | |
| 2017/0170200 A1 | 6/2017 | Ikeda et al. | |
| 2017/0179092 A1 | 6/2017 | Sasaki et al. | |
| 2017/0345985 A1* | 11/2017 | Ide | H01L 33/483 |
| 2017/0358505 A1* | 12/2017 | Chang | H01L 33/62 |
| 2018/0012949 A1 | 1/2018 | Takeya et al. | |
| 2018/0074372 A1 | 3/2018 | Takeya et al. | |
| 2018/0122836 A1 | 5/2018 | Kang et al. | |
| 2019/0244937 A1 | 8/2019 | Honjo et al. | |
| 2020/0142229 A1 | 5/2020 | Kusunoki et al. | |
| 2020/0144504 A1 | 5/2020 | Ishisone et al. | |
| 2020/0167015 A1 | 5/2020 | Fukutome et al. | |
| 2020/0175358 A1 | 6/2020 | Kato et al. | |
| 2020/0175905 A1 | 6/2020 | Yamazaki et al. | |
| 2020/0185420 A1 | 6/2020 | Ikeda et al. | |
| 2021/0358897 A1 | 11/2021 | Iguchi | |

FOREIGN PATENT DOCUMENTS

| | | | |
|---|---|---|---|
| CN | 104282826 A | 1/2015 | |
| CN | 104919900 A | 9/2015 | |
| CN | 105957971 A | 9/2016 | |
| CN | 106935698 A | 7/2017 | |
| CN | 108369787 A | 8/2018 | |
| CN | 108701743 A | 10/2018 | |
| EP | 0936682 A | 8/1999 | |
| EP | 1017111 A | 7/2000 | |
| EP | 1017112 A | 7/2000 | |
| EP | 1045458 A | 10/2000 | |
| EP | 1271664 A | 1/2003 | |
| EP | 1429397 A | 6/2004 | |
| EP | 1429398 A | 6/2004 | |
| EP | 2194590 A | 6/2010 | |
| EP | 2197053 A | 6/2010 | |
| EP | 2197054 A | 6/2010 | |
| EP | 2197055 A | 6/2010 | |
| EP | 2197056 A | 6/2010 | |
| EP | 2197057 A | 6/2010 | |
| EP | 2276080 A | 1/2011 | |
| GB | 2522590 | 7/2015 | |
| JP | 2000-075813 A | 3/2000 | |
| JP | 2007-096055 A | 4/2007 | |
| JP | 2007-123861 A | 5/2007 | |
| JP | 2011-203660 A | 10/2011 | |
| JP | 2013-145833 A | 7/2013 | |
| JP | 2016-508231 | 3/2016 | |
| JP | 2016-171319 A | 9/2016 | |
| JP | 2017-157724 A | 9/2017 | |
| JP | 2017-167515 A | 9/2017 | |
| KR | 2013-0137985 A | 12/2013 | |
| KR | 20140083488 A * | 7/2014 | |
| KR | 2015-0085046 A | 7/2015 | |
| KR | 2016-0110170 A | 9/2016 | |
| KR | 2018-0040073 A | 4/2018 | |
| KR | 2018-0093001 A | 8/2018 | |
| KR | 2018-0104071 A | 9/2018 | |
| TW | 201426700 | 7/2014 | |
| TW | 201637259 | 10/2016 | |
| TW | 201732765 | 9/2017 | |
| TW | 201735391 | 10/2017 | |
| WO | WO-2013/108547 | 7/2013 | |
| WO | WO-2014/099499 | 6/2014 | |
| WO | WO-2017/043216 | 3/2017 | |
| WO | WO-2017/094461 | 6/2017 | |
| WO | WO-2017/098375 | 6/2017 | |
| WO | WO-2017/150257 | 9/2017 | |

OTHER PUBLICATIONS

Written Opinion (Application No. PCT/IB2019/053758) dated Jul. 30, 2019.

Chinese Office Action (Application No. 201980031517.8) dated Jun. 2, 2022 .

(56) References Cited

OTHER PUBLICATIONS

Chinese Office Action (Application No. 201980031517.8) Dated Nov. 8, 2023.

\* cited by examiner

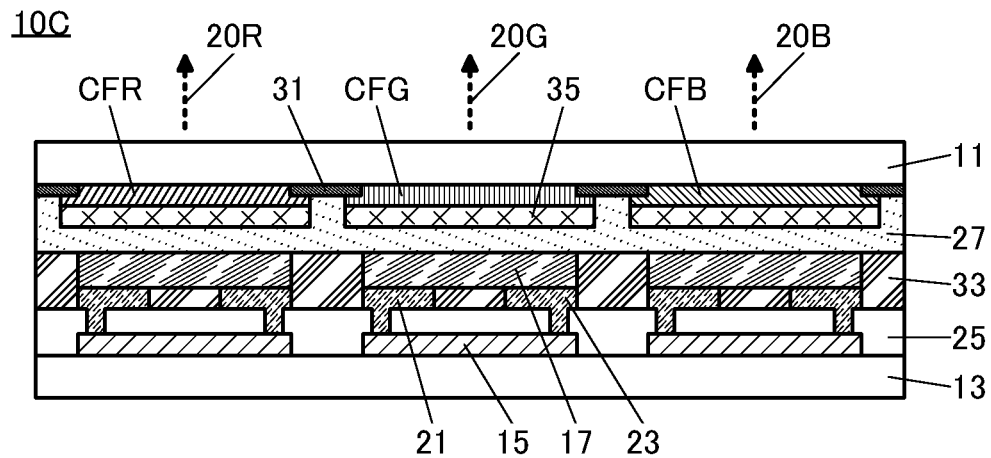
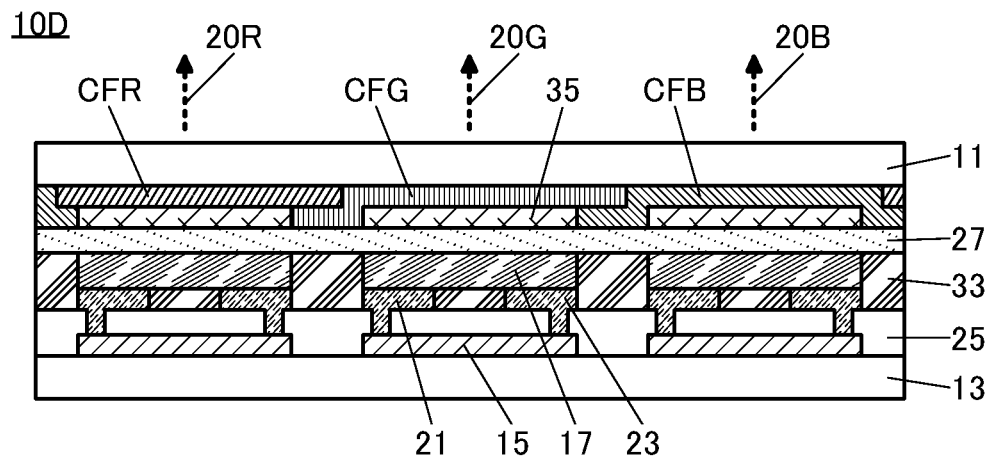
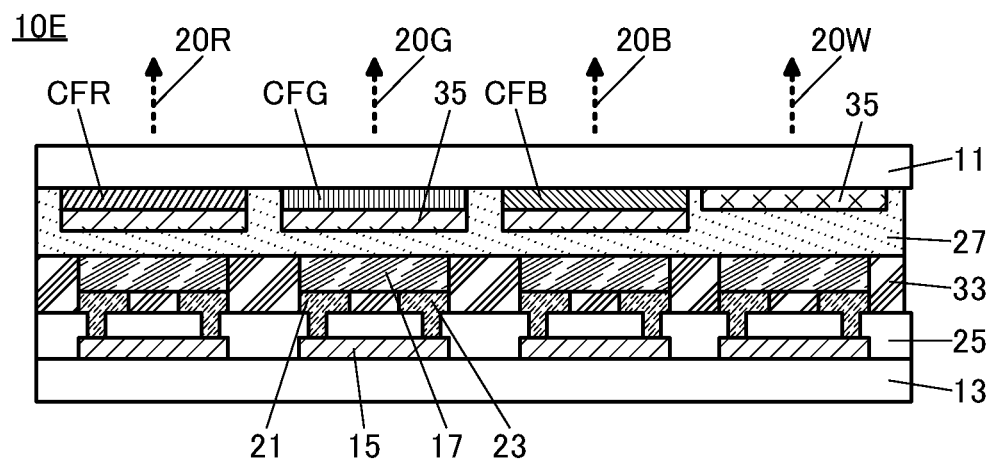

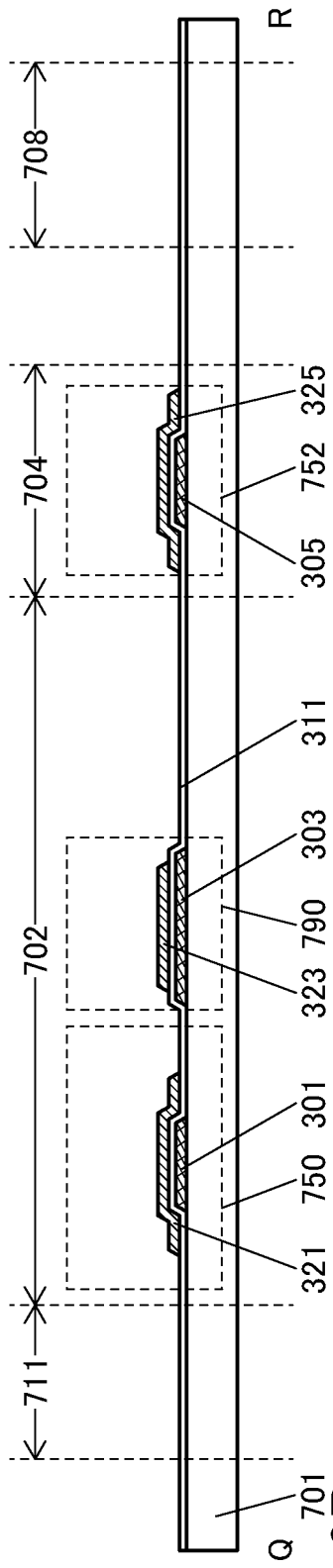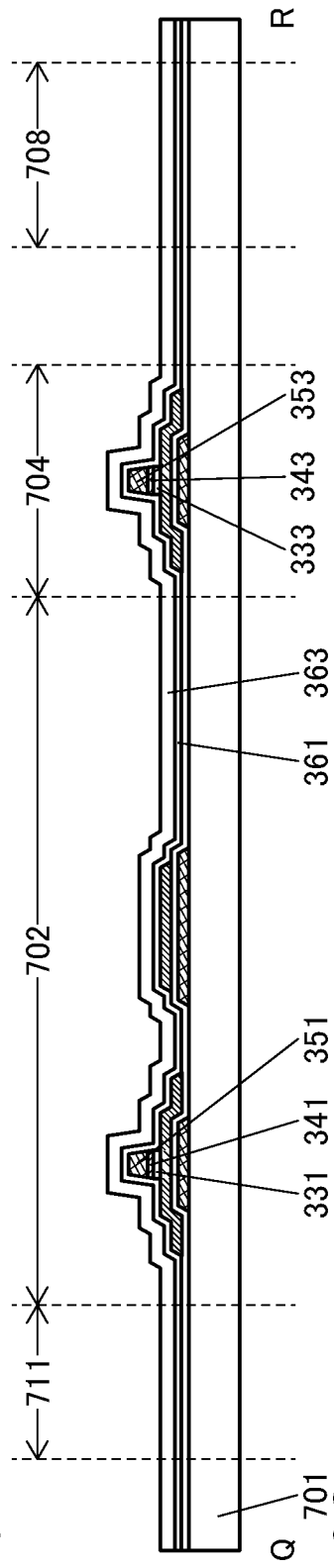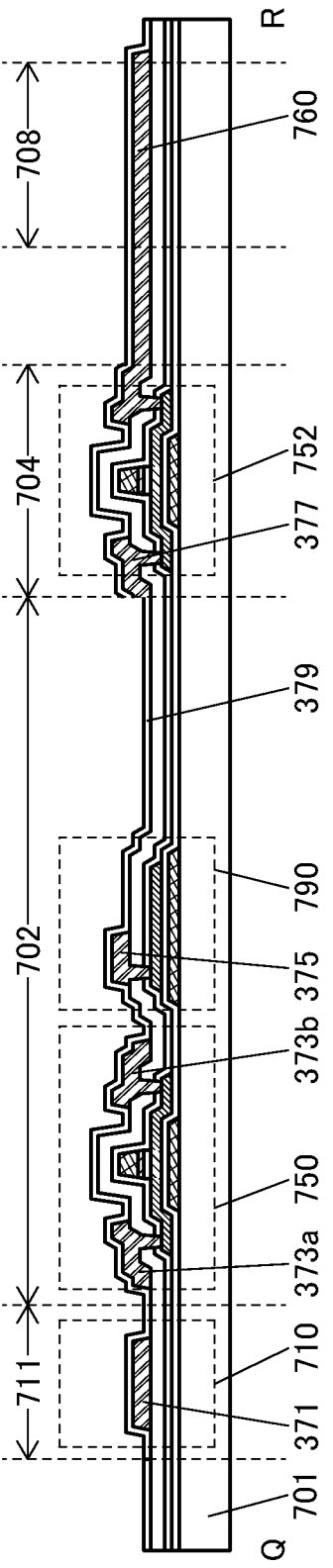

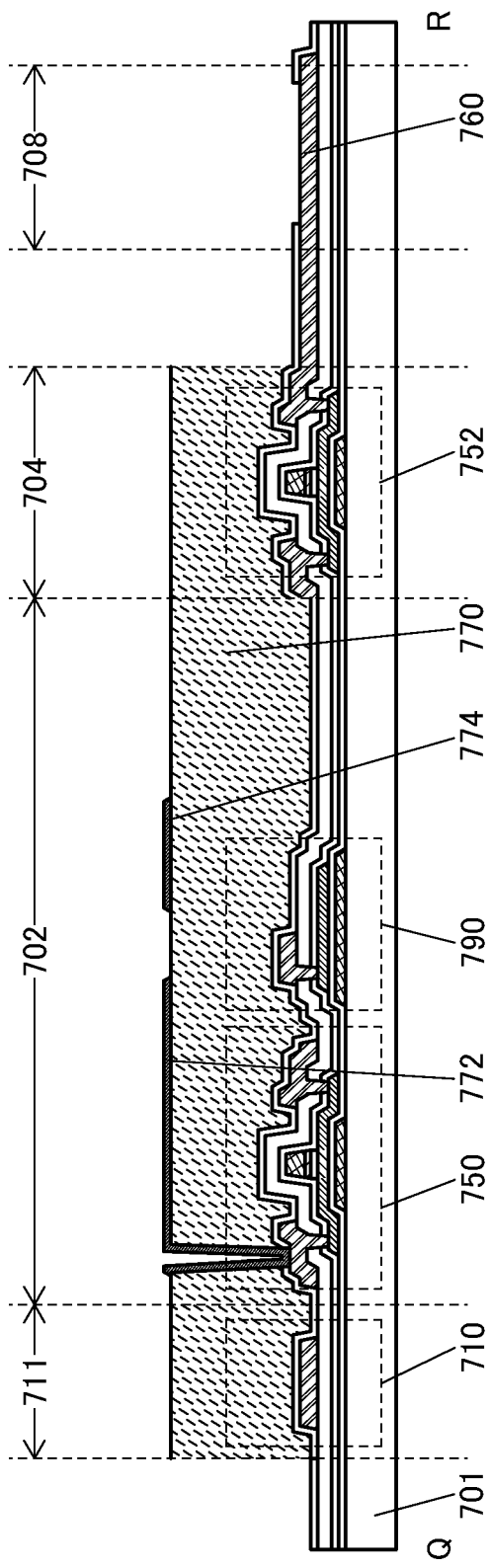
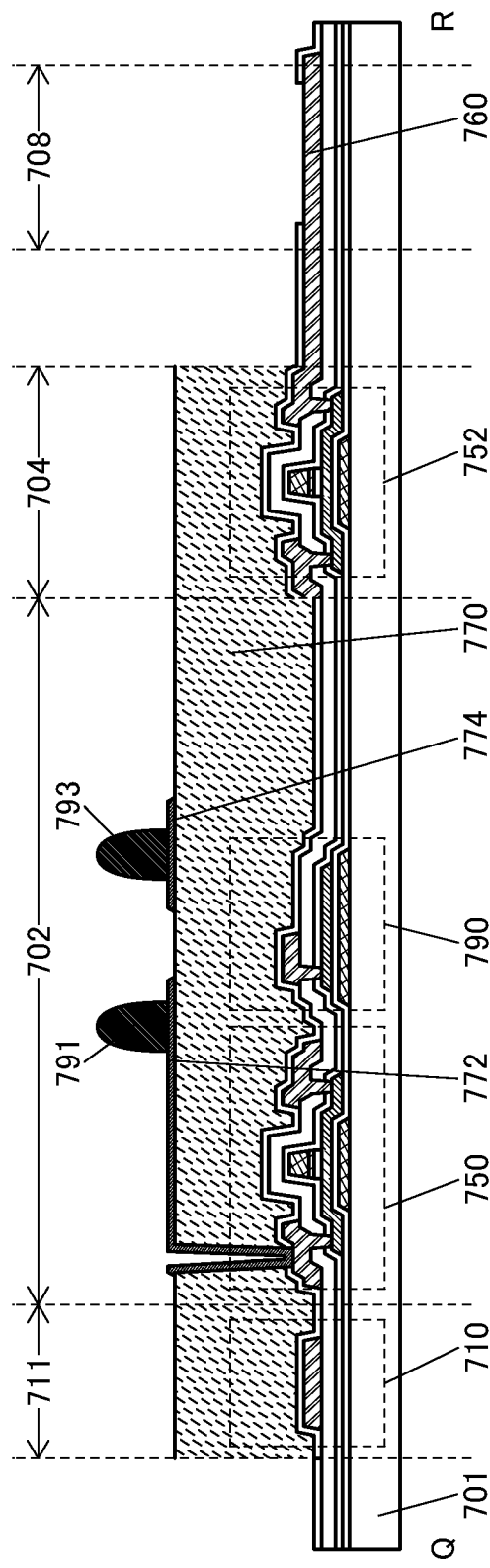
FIG. 10A
FIG. 10B

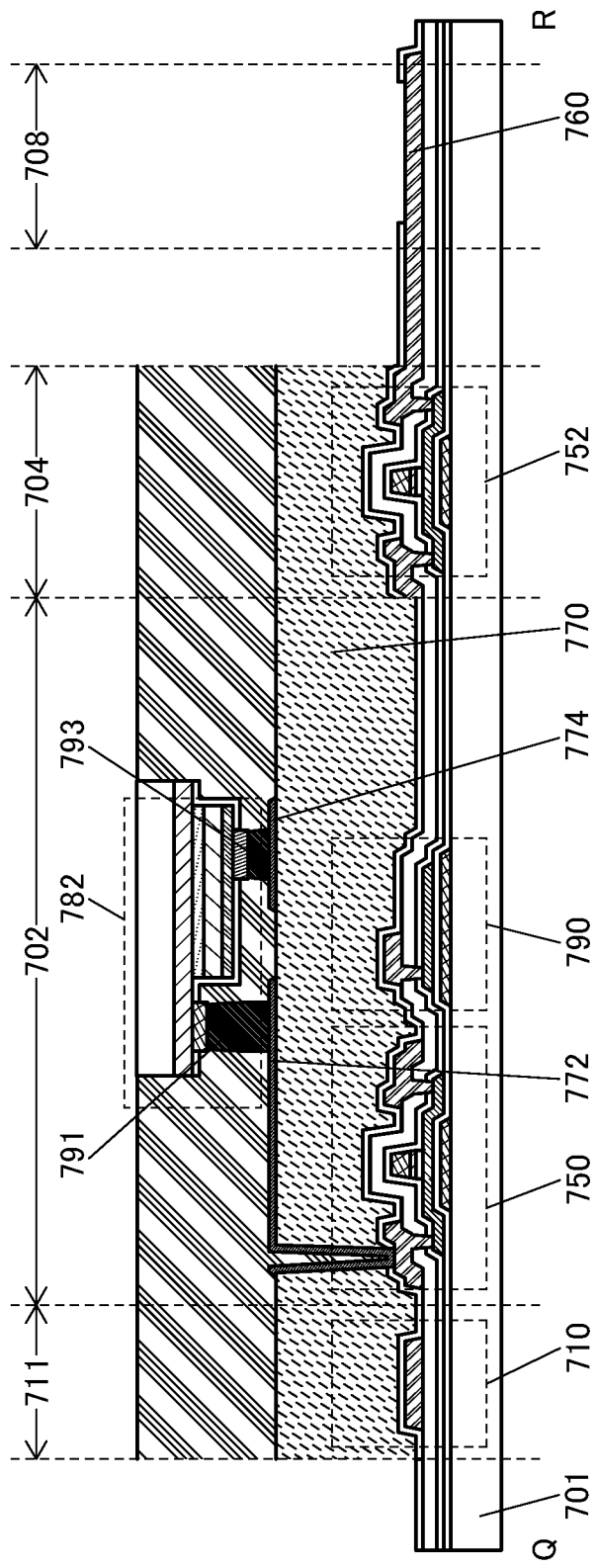
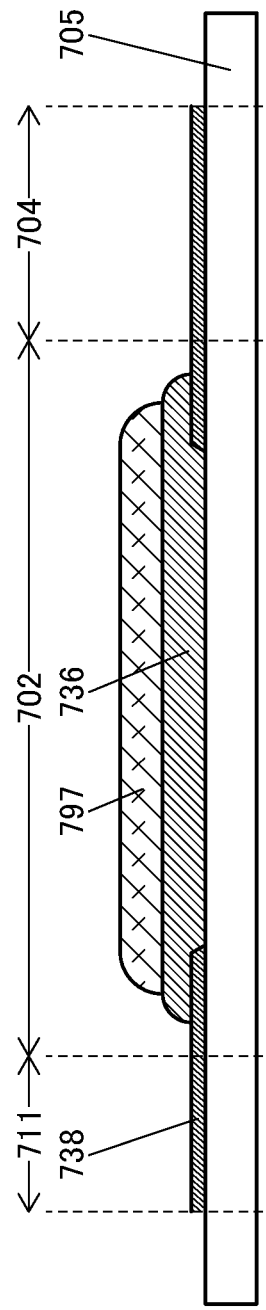

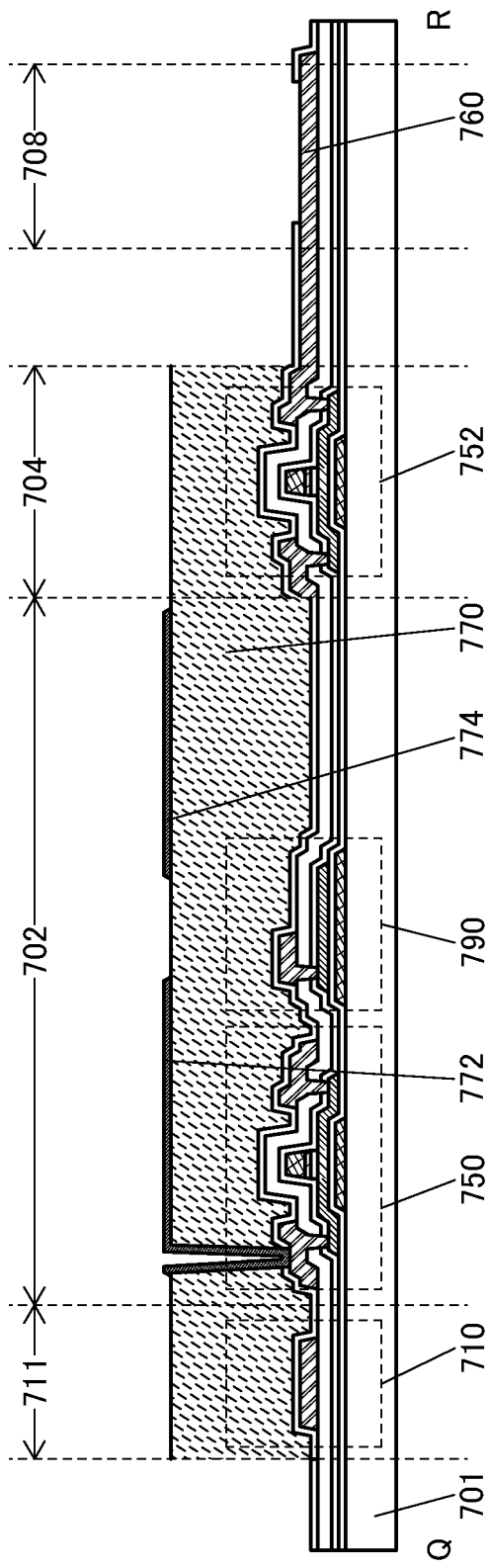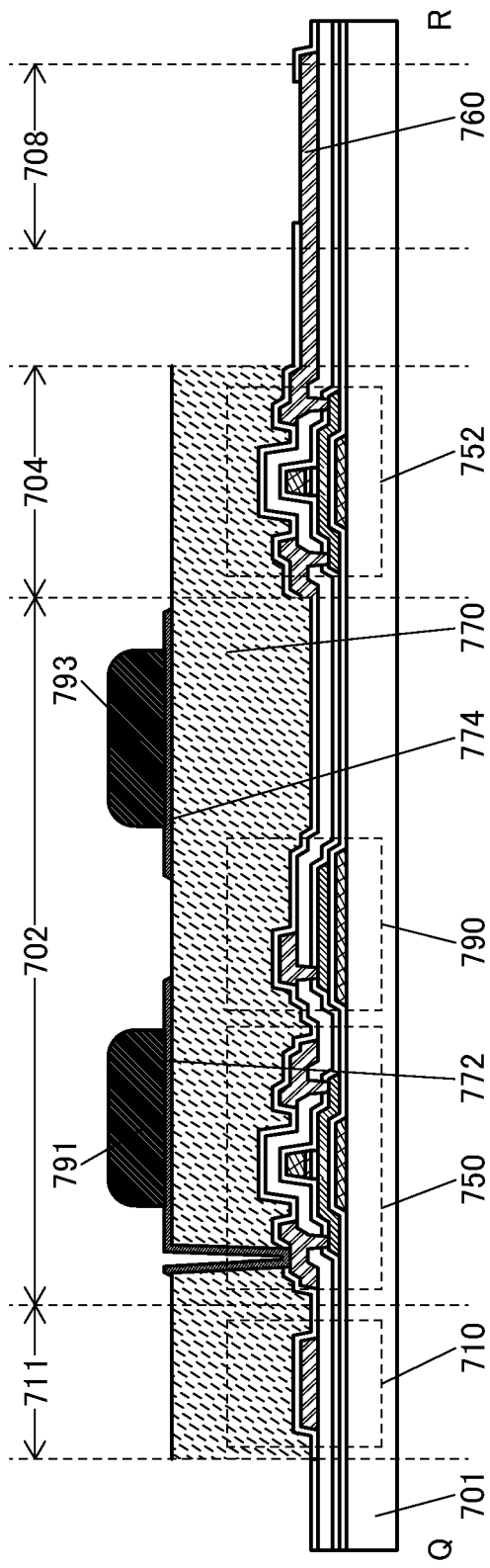

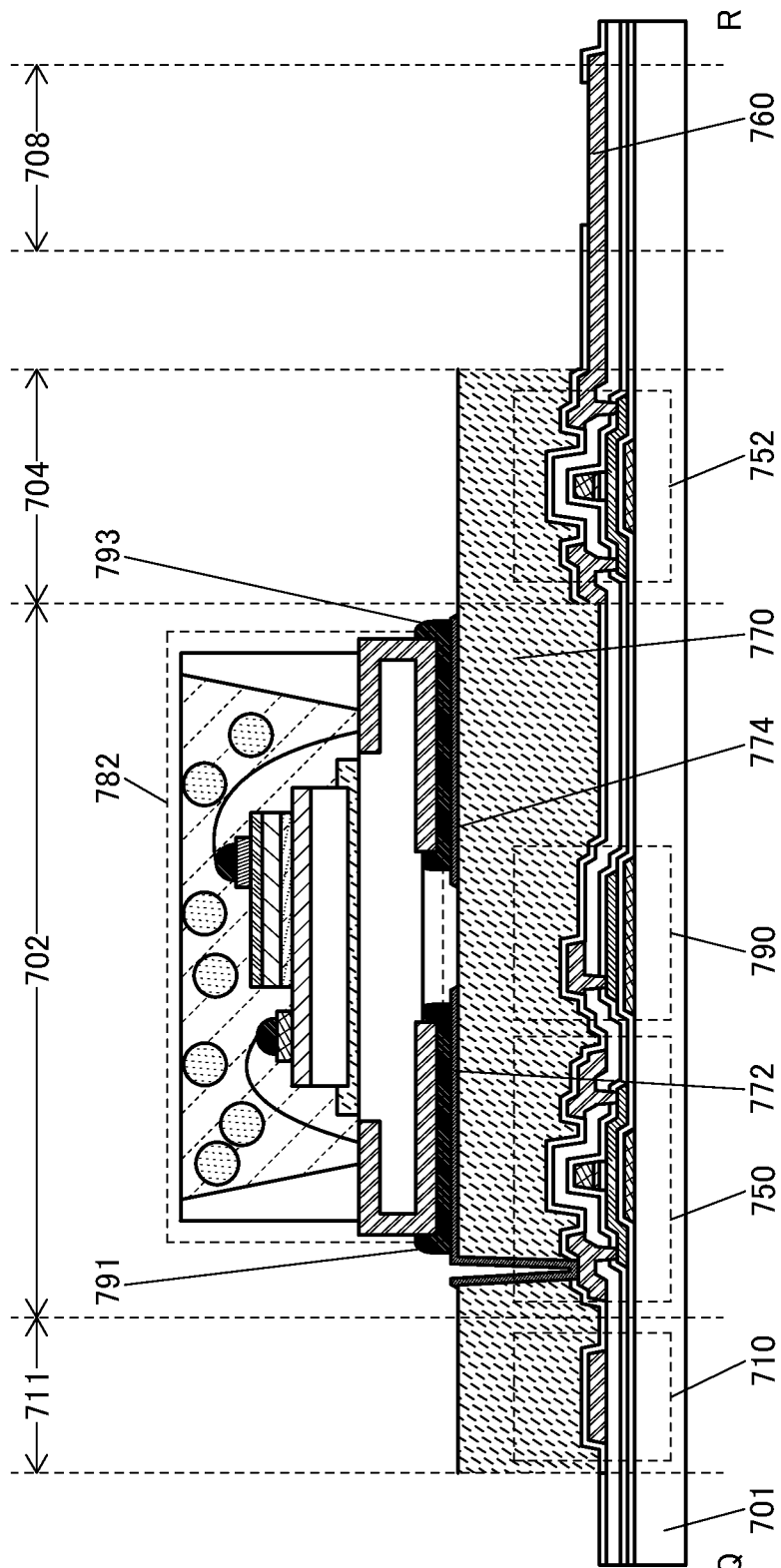
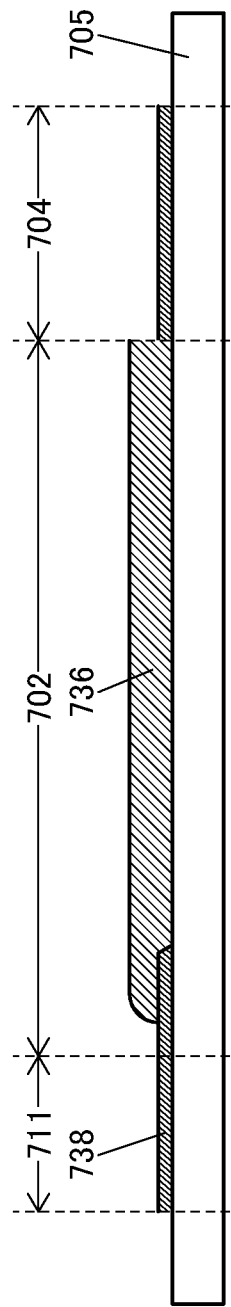

FIG. 16A1
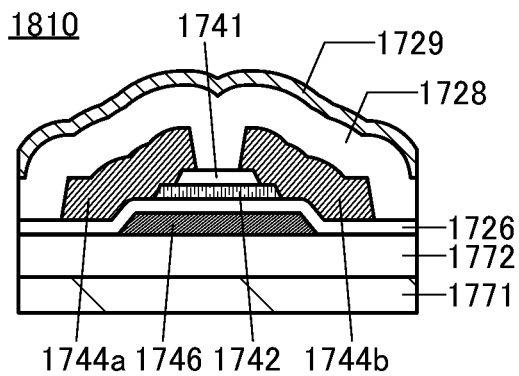
FIG. 16A2
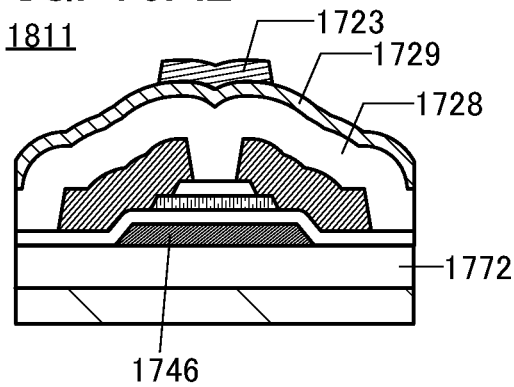
FIG. 16B1
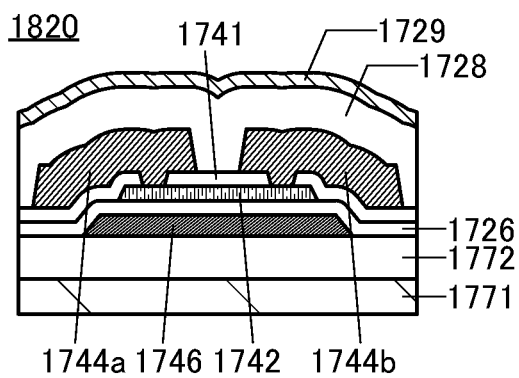
FIG. 16B2
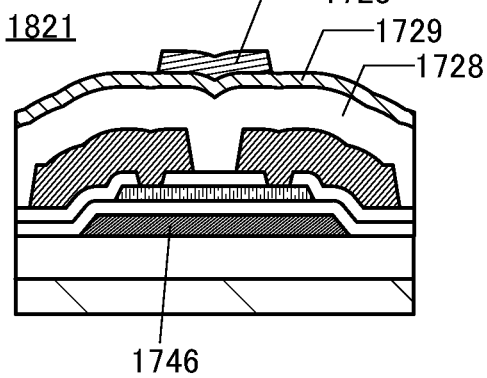
FIG. 16C1
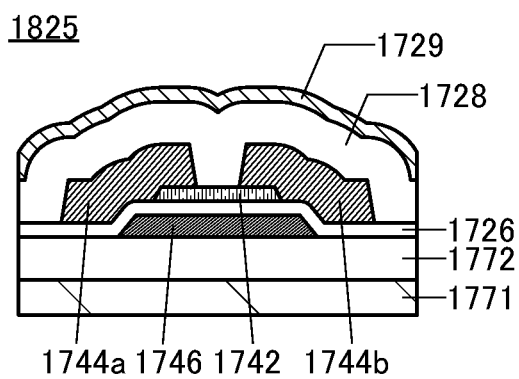
FIG. 16C2
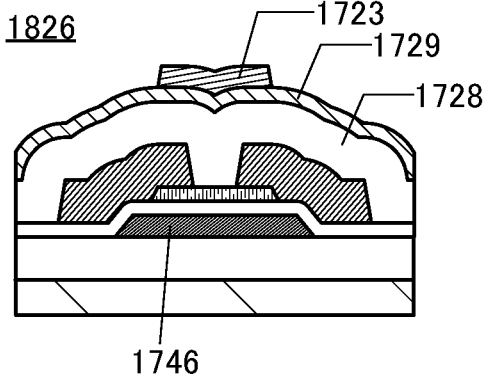

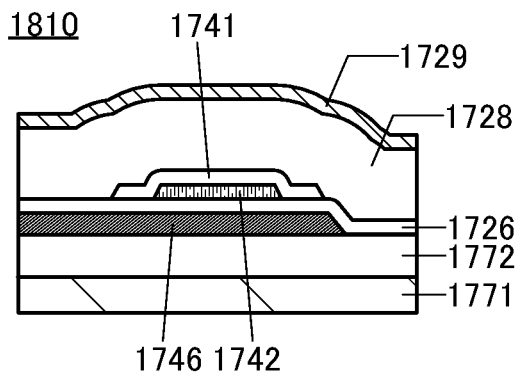
FIG. 17A1
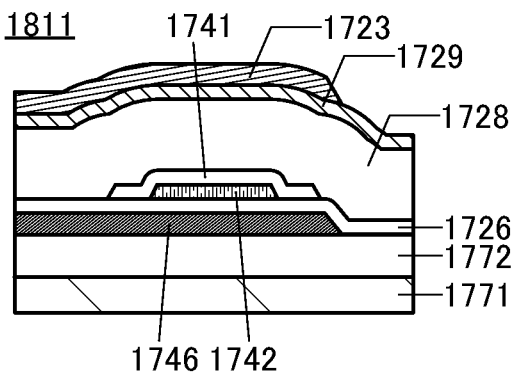
FIG. 17A2
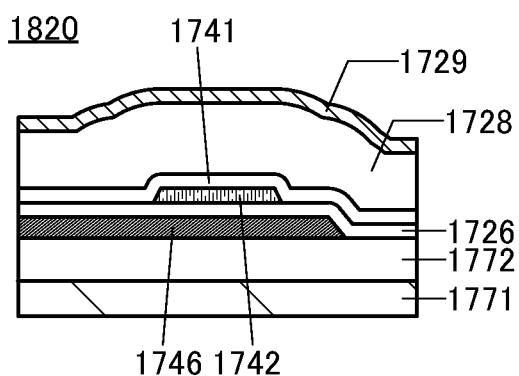
FIG. 17B1
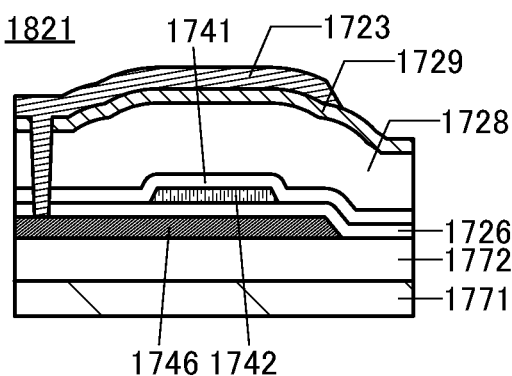
FIG. 17B2
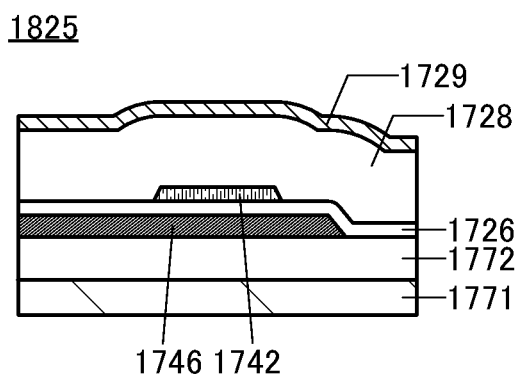
FIG. 17C1
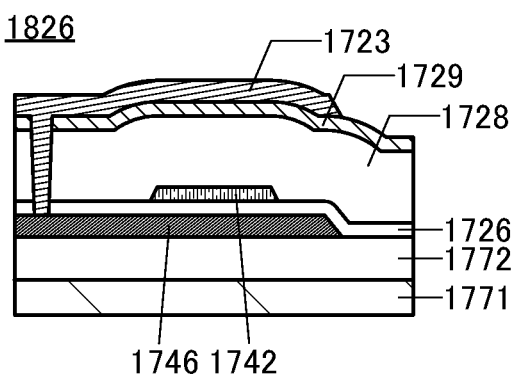
FIG. 17C2

FIG. 18A1
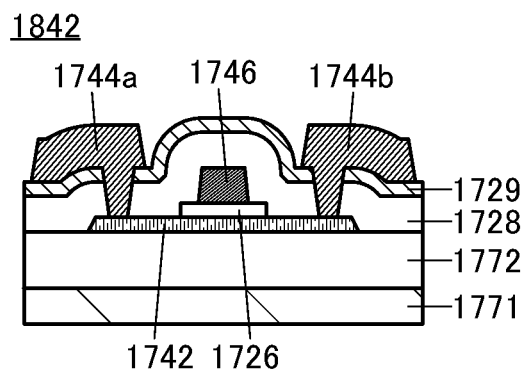
FIG. 18A2
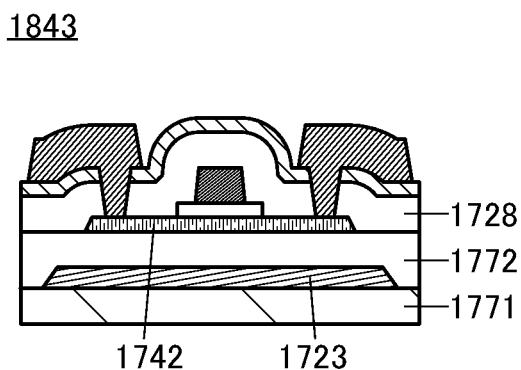
FIG. 18B1
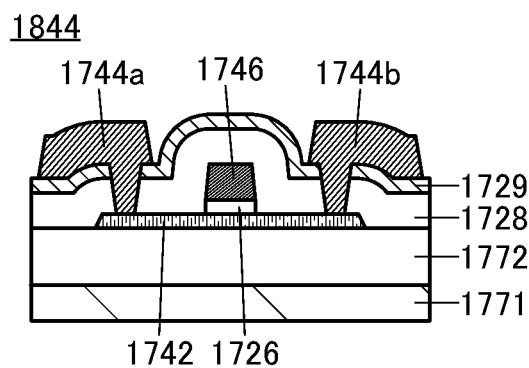
FIG. 18B2
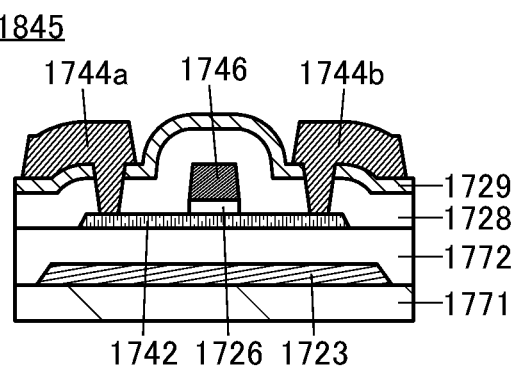
FIG. 18C1
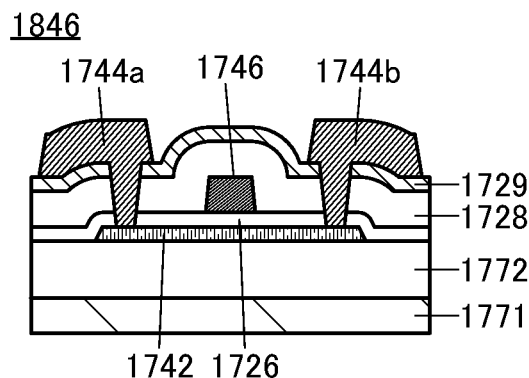
FIG. 18C2
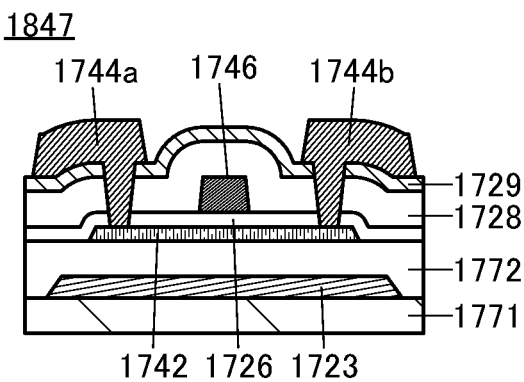

FIG. 19A1
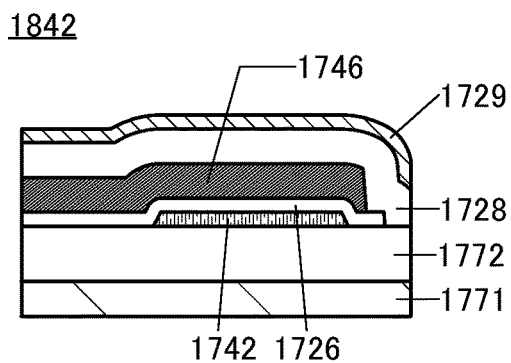
FIG. 19A2
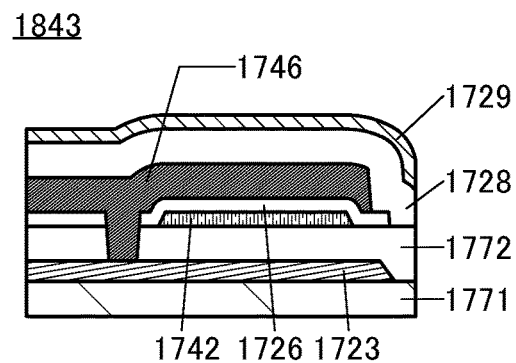
FIG. 19B1
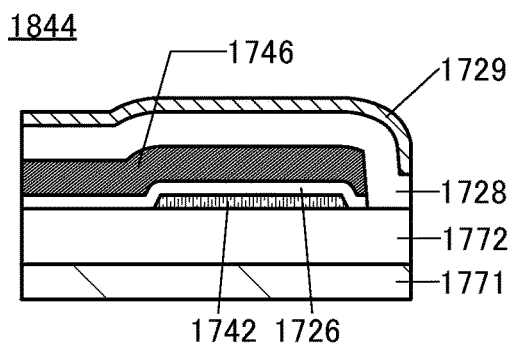
FIG. 19B2
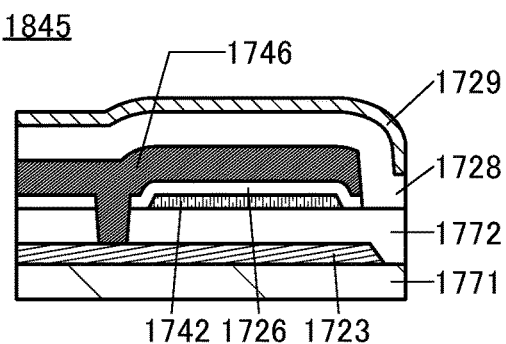
FIG. 19C1
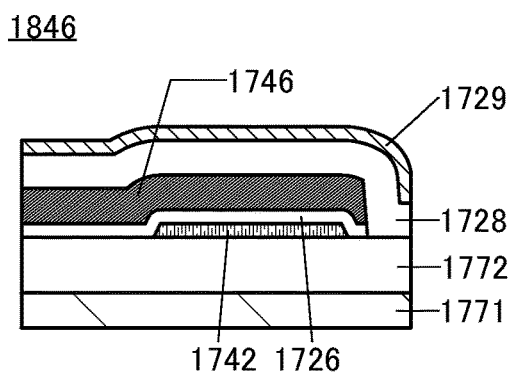
FIG. 19C2
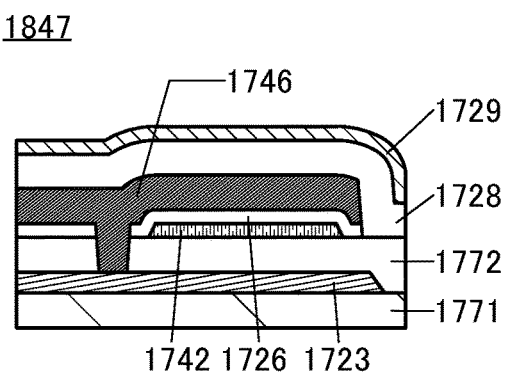

DISPLAY DEVICE

CROSS REFERENCE TO RELATED APPLICATIONS

This application is a U.S. National Phase Application under 35 U.S.C. § 371 of International Application PCT/IB2019/053758, filed on May 8, 2019, which is incorporated by reference and claims the benefit of a foreign priority application filed in Japan on May 17, 2018, as Application No. 2018-095670.

TECHNICAL FIELD

One embodiment of the present invention relates to a display device and a manufacturing method of the display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (including a thin film solar cell, an organic thin film solar cell, and the like), and an electronic device may include a semiconductor device.

BACKGROUND ART

Uses for a display device are diversified in recent years, and for example, the display device is used for a portable information terminal, a television device for home use (also referred to as a TV or a television receiver), digital signage, a PID (Public Information Display), and the like. Examples of the display device include, typically, a display device provided with a light-emitting element such as an organic EL (Electro Luminescence) element or a light-emitting diode (LED), a display device provided with a liquid crystal element, and electronic paper performing display by an electrophoretic method or the like. In addition, the display device is increasingly required to have high luminance for outdoor use.

Disclosed is an active matrix micro LED display device that uses small LEDs (also referred to as micro LEDs) as light-emitting elements and uses transistors as switching elements connected to pixel electrodes (Patent Document 1). In some known active matrix display devices, a metal oxide exhibiting semiconductor characteristics (hereinafter also referred to as an oxide semiconductor) is used in channel formation regions of transistors used as switching elements connected to pixel electrodes (Patent Document 2 and Patent Document 3).

REFERENCES

Patent Documents

[Patent Document 1] United States Patent Application Publication No. 2017/0179092

[Patent Document 2] Japanese Published Patent Application No. 2007-123861

[Patent Document 3] Japanese Published Patent Application No. 2007-096055

SUMMARY OF THE INVENTION

Problems to be Solved by the Invention

An object of one embodiment of the present invention is to provide a display device with high luminance. Another object of one embodiment of the present invention is to provide a display device with high contrast. Another object of one embodiment of the present invention is to provide a display device with high response speed. Another object of one embodiment of the present invention is to provide a display device with low power consumption. Another object of one embodiment of the present invention is to provide a display device manufactured at low cost. Another object of one embodiment of the present invention is to provide a display device with long lifetime. Another object of one embodiment of the present invention is to provide a novel display device.

Note that the description of these objects does not preclude the existence of other objects. Note that one embodiment of the present invention does not have to achieve all these objects. Note that objects other than these can be derived from the description of the specification, the drawings, the claims, and the like.

Means for Solving the Problems

One embodiment of the present invention is a display device including a transistor, a light-emitting element, a coloring layer, a first electrode, and a second electrode; the light-emitting element is electrically connected to the first electrode and the second electrode; the first electrode is electrically connected to the transistor; the second electrode is positioned on the same plane as the first electrode; the coloring layer is positioned over the light-emitting element; the coloring layer includes a region overlapping with the light-emitting element; the light-emitting element includes a light-emitting diode chip; and the light-emitting element has a function of emitting white light.

One embodiment of the present invention is a display device including a transistor, a light-emitting element, a coloring layer, a phosphor layer, a first electrode, and a second electrode; the light-emitting element is electrically connected to the first electrode and the second electrode; the first electrode is electrically connected to the transistor; the second electrode is positioned on the same plane as the first electrode; the coloring layer is positioned over the light-emitting element; the phosphor layer is positioned between the light-emitting element and the coloring layer; the phosphor layer, the light-emitting element, and the coloring layer include a region in which they overlap with one another; the light-emitting element includes a light-emitting diode chip; and the phosphor layer includes a phosphor emitting light of a complementary color of an emission color of the light-emitting element.

Preferably, the aforementioned display device further includes a light-blocking layer; and the light-blocking layer is adjacent to the light-emitting element.

In the aforementioned display device, preferably, the light-emitting element has a function of emitting blue light; and the phosphor layer includes a phosphor emitting yellow light.

In the aforementioned display device, preferably, the light-emitting element has a function of emitting near-ultraviolet light or violet light; and the phosphor layer includes a phosphor emitting red light, a phosphor emitting green light, and a phosphor emitting blue light.

In the aforementioned display device, preferably, the light-emitting element has a function of emitting light toward the coloring layer.

Preferably, the aforementioned display device further includes a first bump and a second bump; the first bump is positioned between one electrode of the light-emitting element and the first electrode; the second bump is positioned between the other electrode of the light-emitting element and the second electrode; the first bump and the second bump include silver; and the first electrode and the second electrode include at least one of silver, aluminum, titanium, and copper.

In the aforementioned display device, the transistor may include an oxide semiconductor in a channel formation region. The transistor may include silicon in the channel formation region.

Effect of the Invention

According to one embodiment of the present invention, a display device with high luminance can be provided. According to another embodiment of the present invention, a display device with high contrast can be provided. According to another embodiment of the present invention, a display device with high response speed can be provided. According to another embodiment of the present invention, a display device with low power consumption can be provided. According to another embodiment of the present invention, a display device manufactured at low cost can be provided. According to another embodiment of the present invention, a display device with long lifetime can be provided. According to another embodiment of the present invention, a novel display device can be provided.

Note that the description of these effects does not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIG. 2 (A), (B), (C) Structure examples of a display device.

FIG. 9 (A), (B), (C) Diagrams illustrating a method for manufacturing a display device.

FIG. 10 (A), (B) Diagrams illustrating a method for manufacturing a display device.

FIG. 12 (A), (B) Diagrams illustrating a method for manufacturing a display device.

FIG. 14 (A), (B) Diagrams illustrating a method for manufacturing a display device.

FIG. 15 (A), (B) Diagrams illustrating a method for manufacturing a display device.

FIG. 16 (A1), (A2), (B1), (B2), (C1), (C2) Diagrams illustrating transistors.

FIG. 17 (A1), (A2), (B1), (B2), (C1), (C2) Diagrams illustrating transistors.

FIG. 18 (A1), (A2), (B1), (B2), (C1), (C2) Diagrams illustrating transistors.

FIG. 19 (A1), (A2), (B1), (B2), (C1), (C2) Diagrams illustrating transistors.

MODE FOR CARRYING OUT THE INVENTION

Figure 1A:
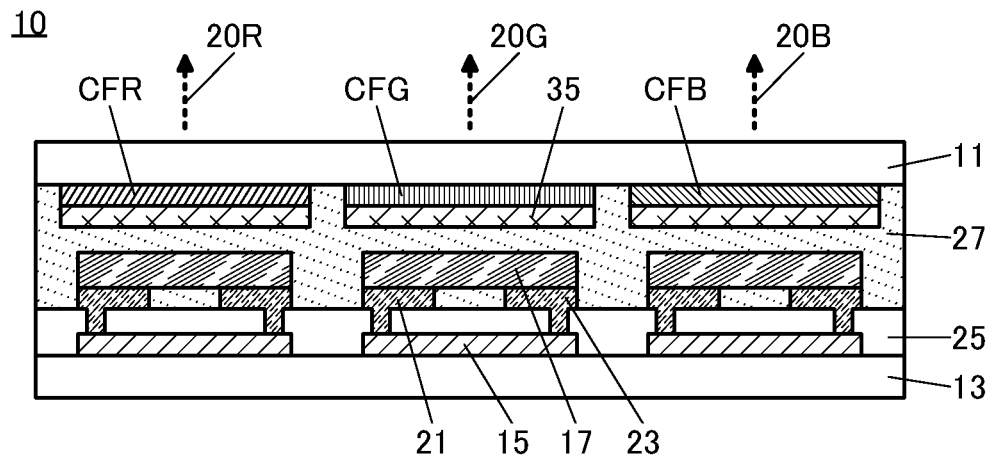
FIG. 1 (A), (B), (C) Structure examples of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Thus, they are not necessarily limited to the illustrated scale.

Note that in this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. An IGFET (Insulated Gate Field Effect Transistor) and a thin film transistor (TFT) are in the category of a transistor in this specification.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacked order (or formation order) of a stacked body or the like is described, even in the case where a surface on which the stacked body is provided (e.g., a formation surface, a support surface, an attachment surface, or a planarization surface) is positioned above the stacked body in the drawings, the direction and the opposite direction are referred to as "under" and "over", respectively, in some cases.

In this specification and the like, a display panel which is one embodiment of a display device has a function of displaying (outputting) an image or the like on (to) a display surface. Therefore, the display panel is one embodiment of an output device.

In this specification and the like, a substrate of a display panel to which a connector such as an FPC(Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a display device of one embodiment of the present invention will be described.

Structure Example 1

An example of a cross-sectional structure of a display device 10 of one embodiment of the present invention is shown in FIG. 1(A).

The display device 10 includes, between a substrate 11 and a substrate 13, a functional layer 15, a light-emitting element 17, a phosphor layer 35, a coloring layer CFR, a coloring layer CFG, a coloring layer CFB, and the like. In FIG. 1(A), the substrate 11 side corresponds to a display surface side of the display device 10.

As the light-emitting element 17, for example, a self-luminous light-emitting element such as an OLED (Organic Light Emitting Diode), an LED, a QLED (Quantum-dot Light Emitting Diode), or a semiconductor laser can be used. In particular, an LED, which has a high luminance, a high contrast, and a high response speed, can be suitably used as the light-emitting element 17, in which case the display device 10 with a high luminance, a high contrast, and a high response speed can be obtained. Since the LED is a self-luminous element and thus needs neither a backlight nor a polarizing plate, a high luminance and low power consumption display device can be achieved. In addition, a light-emitting layer of the LED is formed using an inorganic material, offering a display device that hardly deteriorates and has a long lifetime.

The functional layer 15 is a layer including a circuit for driving the light-emitting element 17. For example, a pixel circuit in the functional layer 15 is composed of a transistor, a capacitor, a wiring, an electrode, and the like. The functional layer 15 is electrically connected to an electrode 21 and an electrode 23. That is, the functional layer 15 is electrically connected to the light-emitting element 17 through the electrode 21 and the electrode 23.

An insulating layer 25 is provided between the functional layer 15 and each of the electrode 21 and the electrode 23. The electrode 21 and the electrode 23 are electrically connected to the functional layer 15 through an opening provided in the insulating layer 25. In this way, the functional layer 15 and the light-emitting element 17 are electrically connected to each other.

The display device 10 includes an adhesive layer 27 between the substrate 11 and each of the electrode 21 and the electrode 23. In other words, the substrate 11 and the substrate 13 are bonded to each other with the adhesive layer 27. The adhesive layer 27 also functions as a sealing layer that seals the light-emitting element 17. Thus, the display device 10 includes, between a pair of substrates, the light-emitting element 17 and the functional layer 15 that drives the light-emitting element.

The coloring layer CFR, the coloring layer CFG, and the coloring layer CFB are each provided on the side of the substrate 11 that is closer to the substrate 13 so as to overlap with the light-emitting element 17. The coloring layer CFR, the coloring layer CFG, and the coloring layer CFB serve as, for example, color filters transmitting red light, green light, and blue light, respectively. Examples of the material that can be used for the coloring layer CFR, the coloring layer CFG, and the coloring layer CFB include a metal material, a resin material, and a resin material containing a pigment or dye.

The phosphor layer 35 is provided between the light-emitting element 17 and each of the coloring layer CFR, the coloring layer CFG, and the coloring layer CFB. As the phosphor layer 35, an organic resin layer or the like mixed with a phosphor can be used. A material capable of being used for the phosphor included in the phosphor layer 35 is excited by light emitted from the light-emitting element 17 and emits light of a complementary color of the emission color of the light-emitting element 17. With such a structure, the phosphor layer 35 can emit white light.

For example, when the phosphor layer 35 includes a phosphor emitting yellow light and the light-emitting element 17 emits blue light, white light is emitted from the phosphor layer 35. Thus, light emitted from the light-emitting element 17 over which the coloring layer CFR is provided passes through the phosphor layer 35 and the coloring layer CFR and is emitted to the display surface side as red light 20R. In the same way, light emitted from the light-emitting element 17 over which the coloring layer CFG is provided is emitted as green light 20G, and light emitted from the light-emitting element 17 over which the coloring layer CFB is provided is emitted as blue light 20B. As a result, color display can be performed with one type of light-emitting element 17. The display device using one type of light-emitting element 17 can be fabricated in a simple process. That is, according to one embodiment of the present invention, a display device with a high luminance, a high contrast, a high response speed, and low power consumption can be obtained at a low manufacturing cost.

For example, a structure in which white light is emitted from the phosphor layer 35 can be obtained when the phosphor layer 35 includes a phosphor emitting red light and the light-emitting element 17 emits blue-green light.

Alternatively, a structure in which white light is emitted from the phosphor layer 35 can be obtained when the phosphor layer 35 includes a phosphor emitting red light, a phosphor emitting green light, and a phosphor emitting blue light and the light-emitting element 17 emits near-ultraviolet light or violet light.

Note that one embodiment of the present invention is not limited to the aforementioned structure in which one color is expressed by three subpixels of red (R), green (G), and blue (B). There is no particular limitation on color elements, and colors other than RGB, e.g., yellow (Y), cyan (C), and magenta (M) can be used.

Figure 1B:
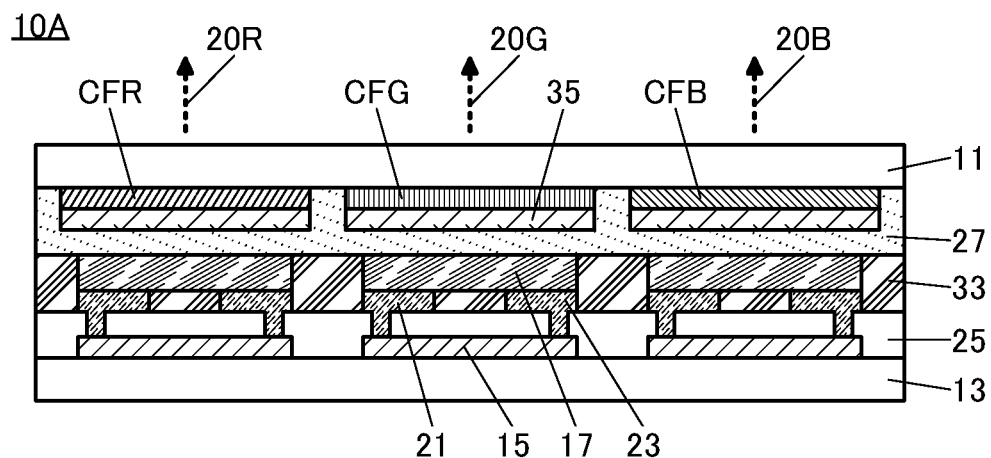

As in a display device 10A shown in FIG. 1(B), a light-blocking layer 33 is preferably provided so as to be adjacent to the light-emitting element 17. The light-blocking layer 33 is preferably provided between adjacent light-emitting elements 17. The light-blocking layer 33 provided between the adjacent light-emitting elements 17 can inhibit light leakage to an adjacent pixel and mixture of colors between pixels. A resin containing pigment, dye, carbon black, or the like can be used for the light-blocking layer 33. Furthermore, a side surface of the light-emitting element 17 is preferably in contact with the light-blocking layer 33. When the side surface of the light-emitting element 17 is covered with the light-blocking layer 33, light leakage to an adjacent pixel and mixture of colors between pixels can be inhibited. Note that one embodiment of the present invention is not limited to the structure shown in FIG. 1(B) in which the level of the top surface of the light-blocking layer 33 is approximately equal to the level of the top surface of the light-emitting element 17. The level of the top surface of the light-blocking layer 33 may be lower than the level of the top surface of the light-emitting element 17 or higher than the level of the top surface of the light-emitting element 17. When the level of the top surface of the light-blocking layer 33 is approximately equal to or higher than the level of the top surface of the light-emitting element 17, light leakage to an adjacent pixel and mixture of colors between pixels can be inhibited efficiently.

Figure 1C:
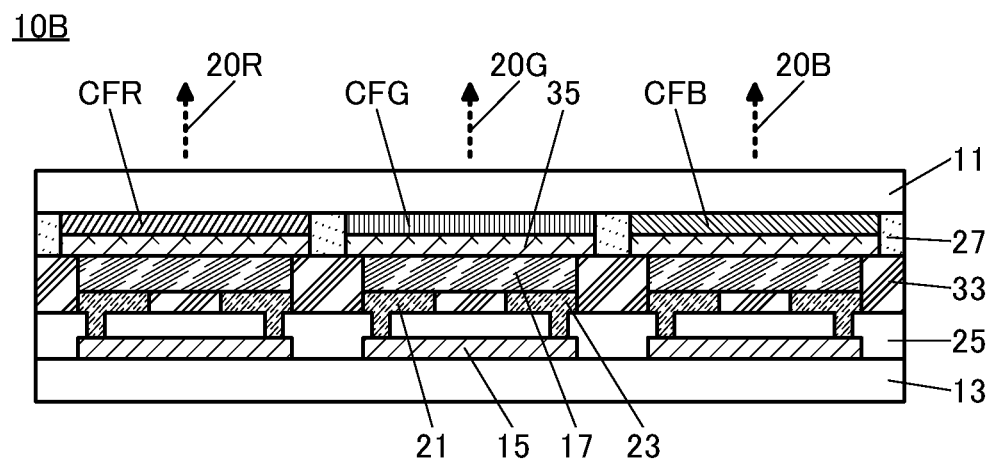

One embodiment of the present invention is not limited to the case shown in FIG. 1(B) in which there is a gap between the light-emitting element 17 and the phosphor layer 35. The light-emitting element 17 and the phosphor layer 35 may be in contact with each other as in a display device 10B shown in FIG. 1(C). Such a structure shortens the distance between the light-emitting element 17 and each of the coloring layer CFR, the coloring layer CFG, and the coloring layer CFB, thereby inhibiting light leakage to an adjacent pixel and mixture of colors between pixels.

A light-blocking layer 31 may be provided as in a display device 10C shown in FIG. 2(A). The light-blocking layer 31 is provided between adjacent coloring layers. The light-blocking layer 31 includes an opening in a region overlapping with the light-emitting element 17. The light-blocking layer 31 blocks light emitted from an adjacent light-emitting element 17 and inhibits mixture of colors between adjacent light-emitting elements 17. Here, light leakage can be inhibited when end portions of each of the coloring layer CFR, the coloring layer CFG, and the coloring layer CFB are provided so as to overlap with the light-blocking layer 31. For the light-blocking layer 31, a material that blocks light emitted from the light-emitting element 17 can be used; for example, a metal material or a resin material containing pigment or dye can be used.

As in a display device 10D shown in FIG. 2(B), each of the coloring layers may be configured to partly overlap with an adjacent coloring layer. A region where the coloring layers overlap functions as a light-blocking layer. Note that one embodiment of the present invention is not limited to the example shown in FIG. 2(B) in which one end portion of the coloring layer CFR overlaps with one end portion of the coloring layer CFG, the other end portion of the coloring layer CFG overlaps with one end portion of the coloring layer CFB, and the other end portion of the coloring layer CFB overlaps with the other end portion of the coloring layer CFR.

A structure in which a pixel not including a coloring layer is further formed and white light 20W is emitted from the pixel can be employed as in a display device 10E shown in FIG. 2(C). With such a structure, one color can be expressed by four subpixels of R (red), G (green), B (blue), and W (white). Such a structure allows a smaller amount of current to flow through the light-emitting element 17 than the structure in which one color is expressed by three subpixels of red (R), green (G), and blue (B), so that a display device with low power consumption can be achieved.

A light-emitting diode chip (hereinafter also referred to as an LED chip) that can be used as the light-emitting element 17 is described.

The LED chip includes a light-emitting diode. There is no particular limitation on the structure of the light-emitting diode; an MIS (Metal Insulator Semiconductor) junction may be used or a homostructure, a heterostructure, a double-heterostructure, or the like having a PN junction or a PIN junction can be used. It is also possible to use a superlattice structure, or a single quantum well structure or a multi quantum well (MQW) structure where thin films producing a quantum effect are stacked.

Figure 3A:
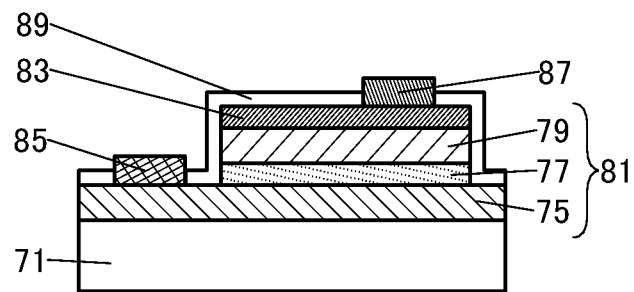
FIG. 3 (A), (B), (C) Structure examples of a light-emitting element.
Figure 3B:
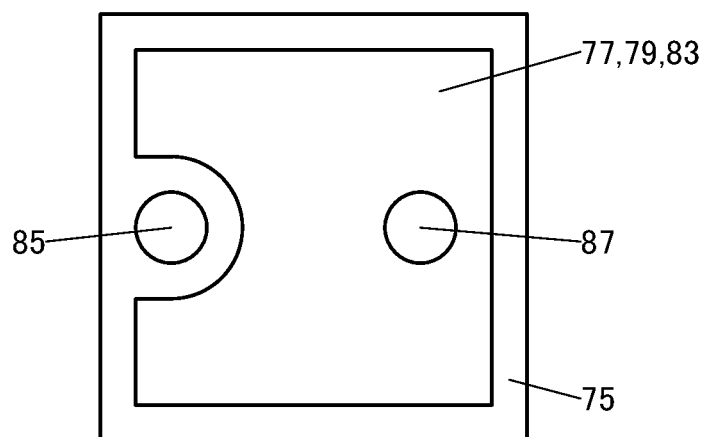

An example of the LED chip is shown in FIG. 3(A) and FIG. 3(B). FIG. 3(A) shows a cross-sectional view of an LED chip 51 and FIG. 3(B) shows a top view of the LED chip 51. The LED chip 51 includes a semiconductor layer 81 and the like. The semiconductor layer 81 includes an n-type semiconductor layer 75, a light-emitting layer 77 over the n-type semiconductor layer 75, and a p-type semiconductor layer 79 over the light-emitting layer 77. A material that can be used for the p-type semiconductor layer 79 has a larger band gap energy than the light-emitting layer 77 and allows carriers to be trapped in the light-emitting layer 77. Also in the LED chip 51, an electrode 85 functioning as a cathode is provided over the n-type semiconductor layer 75, an electrode 83 functioning as a contact electrode is provided over the p-type semiconductor layer 79, and an electrode 87 functioning as an anode is provided over the electrode 83. In addition, a top surface and side surfaces of the electrode 83 are preferably covered with an insulating layer 89. The insulating layer 89 functions as a protective film of the LED chip 51.

The LED chip that can be used as the light-emitting element 17 has a light emission area of 1 mm$^2$ or less, preferably 10000 μm$^2$ or less, further preferably 3000 μm$^2$ or less, and still further preferably 700 μm$^2$ or less. Note that in this specification and the like, an LED chip with a light emission area of 10000 μm$^2$ or less is referred to as a micro LED in some cases.

Figure 3C:
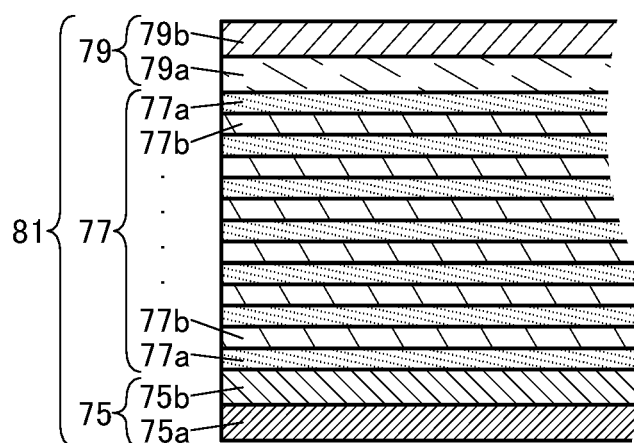

An example of an enlarged view of the semiconductor layer 81 is shown in FIG. 3(C). As shown in FIG. 3(C), the n-type semiconductor layer 75 may include an n-type contact layer 75a on a substrate 71 side and an n-type clad layer 75b on the light-emitting layer 77 side. The p-type semiconductor layer 79 may include a p-type clad layer 79a on the light-emitting layer 77 side and a p-type contact layer 79b over the p-type clad layer 79a.

The light-emitting layer 77 can have an MQW structure where a barrier layer 77a and a well layer 77b are stacked plural times. The barrier layer 77a preferably uses a material having a larger band gap energy than that for the well layer 77b. Such a structure allows the energy to be trapped in the well layer 77b, thereby improving the quantum efficiency and the emission efficiency of the LED chip 51.

In the LED chip 51 of a face-up type, a light-transmitting material can be used for the electrode 83; for example, an oxide such as ITO (In$_2$O$_3$—SnO$_2$), AZO (Al$_2$O$_3$—ZnO), In—Zn oxide (In$_2$O$_3$—ZnO), GZO (GeO$_2$—ZnO), or ICO (In$_2$O$_3$—CeO$_2$) can be used. In the LED chip 51 of a face-up type, light is mainly emitted to the electrode 87 side. In the LED chip 51 of a face-down type, a light-reflecting material can be used for the electrode 83; for example, a metal such as silver, aluminum, or rhodium can be used. In the LED chip 51 of a face-down type, light is mainly emitted to the substrate 71 side.

For the substrate 71, oxide single crystal such as sapphire single crystal (Al$_2$O$_3$), spinel single crystal (MgAl$_2$O$_4$), ZnO single crystal, LiAlO$_2$ single crystal, LiGaO$_2$ single crystal, or MgO single crystal, Si single crystal, SiC single crystal, GaAs single crystal, AlN single crystal, GaN single crystal, boride single crystal such as ZrB$_2$, or the like can be used. In the LED chip 51 of a face-down type, a light-transmitting material is preferably used for the substrate 71; for example, sapphire single crystal or the like can be used.

A buffer layer (not shown) may be provided between the substrate 71 and the n-type semiconductor layer 75. The buffer layer has a function of alleviating the difference in lattice constant between the substrate 71 and the n-type semiconductor layer 75.

The LED chip 51 that can be used as the light-emitting element 17 preferably has a horizontal structure where the electrode 85 and the electrode 87 are positioned on the same plane side as shown in FIG. 3(A). When the electrode 85 and the electrode 87 are provided on the same plane side in the LED chip 51, the electrode 21 and the electrode 23 can be easily connected thereto and can each have a simple structure. The LED chip 51 that can be used as the light-emitting element 17 is preferably of a face-down type. The use of the LED chip 51 of a face-down type allows light from the LED chip 51 to be efficiently emitted to the display surface side of the display device, so that the display device can have high luminance. A commercial LED chip may be used as the LED chip 51.

The phosphor layer 35 can include a phosphor such as an organic resin layer having a surface on which a phosphor is printed or which is coated with a phosphor, or an organic resin layer mixed with a phosphor. For the phosphor layer 35, a material that is excited by light emitted from the LED chip 51 and emits light of a complementary color of the emission color of the LED chip 51 can be used. With such a structure, white light can be emitted from the phosphor layer 35.

For example, a structure where white light is emitted from the phosphor layer 35 can be obtained with use of the LED chip 51 emitting blue light and a phosphor emitting yellow light, which is a complementary color of blue. The LED chip 51 that can emit blue light is typically a diode made of a Group 13 nitride-based compound semiconductor, e.g., a diode containing a GaN-based material which is represented by a formula, In$_x$Al$_y$Ga$_{1-x-y}$N (x is greater than or equal to 0 and less than or equal to 1, y is greater than or equal to 0 and less than or equal to 1, and x+y is greater than or equal to 0 and less than or equal to 1). Typical examples of the phosphor that is excited by blue light and emits yellow light include Y$_3$Al$_5$O$_{12}$:Ce(YAG:Ce) and (Ba,Sr,Mg)$_2$SiO$_4$:Eu, Mn.

For example, a structure where white light is emitted from the phosphor layer 35 can be obtained with use of the LED chip 51 emitting blue-green light and a phosphor emitting red light, which is a complementary color of blue-green.

The phosphor layer 35 may include a plurality of kinds of phosphors and each of the phosphors may emit light of a different color. For example, a structure where white light is emitted from the phosphor layer 35 can be obtained with use of the LED chip 51 emitting blue light, a phosphor emitting red light, and a phosphor emitting green light. Typical examples of the phosphor that is excited by blue light and emits red light include (Ca,Sr)S:Eu and Sr$_2$Si$_7$Al$_3$ON$_{13}$:Eu. Typical examples of the phosphor that is excited by blue light and emits green light include SrGa$_2$S$_4$:Eu and Sr$_3$Si$_{13}$Al$_3$O$_2$N$_{21}$:Eu.

A structure where white light is emitted from the phosphor layer 35 can be obtained with use of the LED chip 51 emitting near-ultraviolet light or violet light, a phosphor emitting red light, a phosphor emitting green light, and a phosphor emitting blue light. Typical examples of the phosphor that is excited by near-ultraviolet light or violet light and emits red light include (Ca,Sr)S:Eu, Sr$_2$Si$_7$Al$_3$ON$_{13}$:Eu, and La$_2$O$_2$S:Eu. Typical examples of the phosphor that is excited by near-ultraviolet light or violet light and emits green light include SrGa$_2$S$_4$:Eu and Sr$_3$Si$_{13}$Al$_3$O$_2$N$_{21}$:Eu. Typical examples of the phosphor that is excited by near-ultraviolet light or violet light and emits blue light include Sr$_{10}$(PO$_4$)$_6$Cl$_2$:Eu and (Sr,Ba,Ca)$_{10}$(PO$_4$)$_6$Cl$_2$:Eu.

Note that near-ultraviolet light has a maximum peak at a wavelength of 200 nm to 380 nm in an emission spectrum. Violet light has a maximum peak at a wavelength of 380 nm to 430 nm in an emission spectrum. Blue light has a maximum peak at a wavelength of 430 nm to 490 nm in an emission spectrum. Green light has a maximum peak at a wavelength of 490 nm to 550 nm in an emission spectrum. Yellow light has a maximum peak at a wavelength of 550 nm to 590 nm in an emission spectrum. Red light has a maximum peak at a wavelength of 640 nm to 770 nm in an emission spectrum.

In the case where the phosphor layer 35 includes a phosphor emitting yellow light and the LED chip 51 emitting blue light is used, light emitted from the LED chip 51 preferably has a maximum peak at a wavelength of 330 nm to 500 nm in an emission spectrum, further preferably a maximum peak at a wavelength of 430 nm to 490 nm, and still further preferably a maximum peak at a wavelength of 450 nm to 480 nm. This allows efficient excitation of the phosphor. When light emitted from the LED chip 51 has a maximum peak at 430 nm to 490 nm in an emission spectrum, blue light that is excitation light and yellow light that is from the phosphor can be mixed to be white light. Furthermore, when light emitted from the LED chip 51 has a maximum peak at 450 nm to 480 nm, white with high purity can be obtained.

Note that a variety of optical members may be arranged on the outside of the substrate 11. Examples of the optical members include a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, or the like may be arranged on the outside of the substrate 11.

A touch sensor may be provided on the outer side of the substrate 11. Thus, a structure including the display device 10 and the touch sensor can function as a touch panel.

Structure Example 2

A different structure of the aforementioned display device will be described. An LED package can be used as the light-emitting element 17 included in the display device of one embodiment of the present invention.

The LED package that can be used as the light-emitting element 17 is described.

Figure 4A:
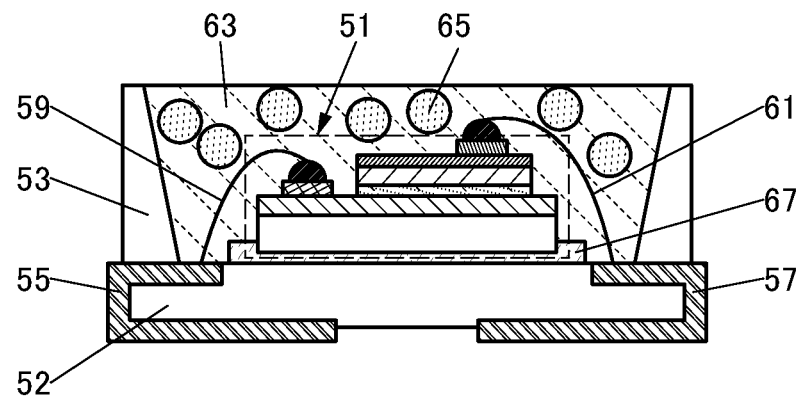
FIG. 4 (A), (B), (C) Structure examples of a light-emitting element.
Figure 4B:
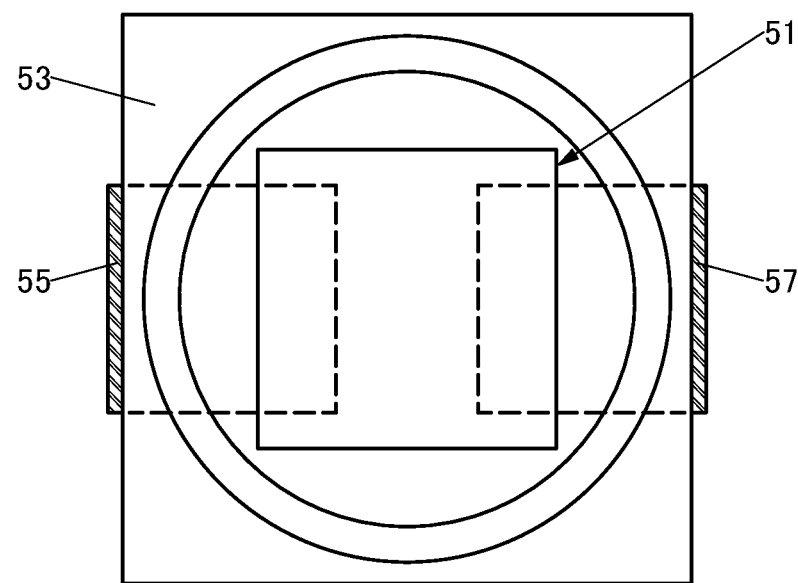

As the light-emitting element 17, a conventional LED package such as a mold type or a surface mount (SMD: Surface Mount Device) type LED package can be used. In particular, the surface mount type LED package is preferably used as the light-emitting element 17. FIG. 4(A) and FIG. 4(B) show an example of the surface mount type LED package. FIG. 4(A) shows a cross-sectional view of an LED package 50 and FIG. 4(B) shows a top view of the LED package 50. The LED package 50 includes the LED chip 51 over a substrate 52, an electrode 55, and an electrode 57. The LED chip 51 is electrically connected to the electrode 55 and the electrode 57 through a wire 59 and a wire 61. In addition, a phosphor 65 and a resin layer 63 having a light-transmitting property are provided over the LED chip 51. The substrate 52 and the LED chip 51 are bonded with an adhesive layer 67. Note that a commercial LED package may be used as the light-emitting element 17.

The LED package that can be used as the light-emitting element 17 has a light emission area of 1 mm$^2$ or less, preferably 10000 µm$^2$ or less, further preferably 3000 µm$^2$ or less, and still further preferably 700 µm$^2$ or less. Note that in this specification and the like, an LED package with a light emission area of 10000 µm$^2$ or less is referred to as a micro LED in some cases.

As the substrate 52, a glass epoxy resin substrate, a polyimide substrate, a ceramic substrate, an alumina substrate, an aluminum nitride substrate, or the like can be used.

As the phosphor 65, an organic resin layer having a surface on which a phosphor is printed or which is coated with a phosphor, an organic resin layer mixed with a phosphor, or the like can be used. For the phosphor 65, a material that is excited by light emitted from the LED chip 51 and emits light of a complementary color of the emission color of the LED chip 51 can be used. With such a structure, white light can be emitted from the LED package 50. For the phosphor 65, the above description of the phosphor included in the phosphor layer 35 can be referred to, and thus, detailed description of the phosphor 65 is omitted.

For example, a structure where white light is emitted from the LED package 50 can be obtained with use of the LED chip 51 emitting blue-green light and a phosphor emitting red light, which is a complementary color of blue-green.

A structure where white light is emitted from the LED package 50 can be obtained with use of the LED chip 51 emitting near-ultraviolet light or violet light, a phosphor emitting red light, a phosphor emitting green light, and a phosphor emitting blue light.

In the case where the LED package 50 includes the LED chip 51 emitting blue light and the phosphor 65 emitting yellow light, light emitted from the LED chip 51 preferably has a maximum peak at a wavelength of 330 nm to 500 nm in an emission spectrum, further preferably a maximum peak at a wavelength of 430 nm to 490 nm, and still further preferably a maximum peak at a wavelength of 450 nm to 480 nm. This allows efficient excitation of the phosphor 65. When light emitted from the LED chip 51 has a maximum peak at 430 nm to 490 nm in an emission spectrum, blue light that is excitation light and yellow light that is from the phosphor 65 can be mixed to be white light. Furthermore, when light emitted from the LED chip 51 has a maximum peak at 450 nm to 480 nm, white with high purity can be obtained.

The resin layer 63 is formed using a light-transmitting organic resin. There is no particular limitation on the kind of organic resin, and typically, an ultraviolet curable resin such as an epoxy resin or a silicone resin, a visible light curable resin, or the like can be used as appropriate. Note that although the resin layer 63 has a flat top surface shape in FIG. 4(A), one embodiment of the present invention is not limited thereto. For example, the top surface of the resin layer 63 may have a projecting shape. The shape can be selected as appropriate depending on desired directivity.

For the wire 59 and the wire 61, a metal thin wire made of gold, an alloy containing gold, copper, or an alloy containing copper can be used.

The electrode 55 and the electrode 57 are conductive layers electrically connected to the electrodes of the LED chip 51, and are formed using an element selected from nickel, copper, silver, platinum, and gold or an alloy material including any of the elements at 50% or more. The electrode 55 and the electrode 57 are connected to the electrodes of the LED chip 51 by a wire bonding method using a thermocompression bonding method or an ultrasonic bonding method.

A reflector 53 made of ceramic or the like is preferably arranged around the LED chip 51 so as to reflect part of light emitted from the LED chip 51, in which case a larger amount of light can be released from the LED package 50. Note that although the reflector 53 has an upwardly tapered shape in FIG. 4(A), one embodiment of the present invention is not limited thereto. The shape can be selected as appropriate depending on desired directivity.

Note that the LED package 50 shown in FIG. 4(A) has a structure where a face-up type LED chip is used, i.e., light is emitted to the electrode side of the LED chip 51; however, there is no particular limitation on the structure of the LED package 50 that can be used in one embodiment of the present invention.

Figure 4C:
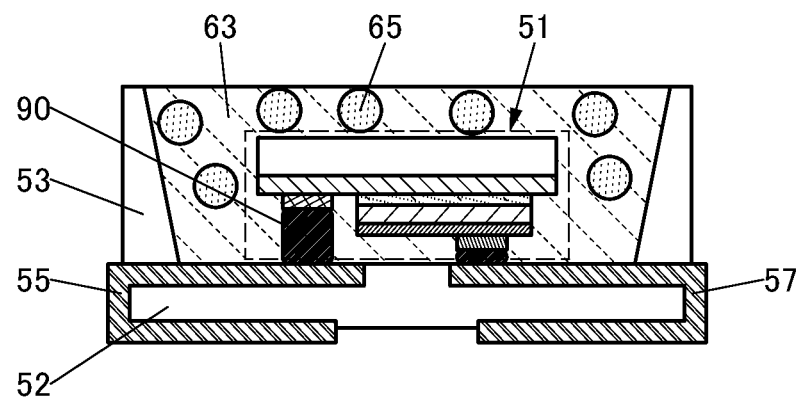

FIG. 4(C) shows another example of the LED package illustrated in FIG. 4(A). FIG. 4(C) is a cross-sectional view of the LED package 50. FIG. 4(B) can be referred to for the top view. The LED package 50 shown in FIG. 4(C) is a flip-chip type LED package where the electrodes of the LED chip 51 face the electrode 55 and the electrode 57. The electrodes of the LED chip 51 are electrically connected to the electrode 55 and the electrode 57 through a conductive bump 90. The LED package 50 shown in FIG. 4(C) has a structure where a face-down type LED chip is used, i.e., light is emitted to the side opposite to the electrode side of the LED chip 51. Although FIG. 4(A) and FIG. 4(C) show the LED chip 51 with a vertical structure, one embodiment of the present invention is not limited thereto. The LED chip 51 included in the LED package 50 may have a vertical structure where the electrode 85 and the electrode 87 are arranged on opposite sides.

Note that FIG. 4 shows an example where the LED package 50 includes one LED chip 51; however, the structure of the LED package 50 that can be used in one embodiment of the present invention is not limited thereto. The LED package 50 may include a plurality of LED chips 51. A structure without the phosphor 65 can also be employed. For example, white light may be emitted from the LED package 50 with a structure that includes the LED chip 51 emitting red light, the LED chip 51 emitting green light, and the LED chip 51 emitting green light and does not include the phosphor 65.

Structures of a display device that uses the LED package 50 as the light-emitting element 17 are described.

Figure 5A:
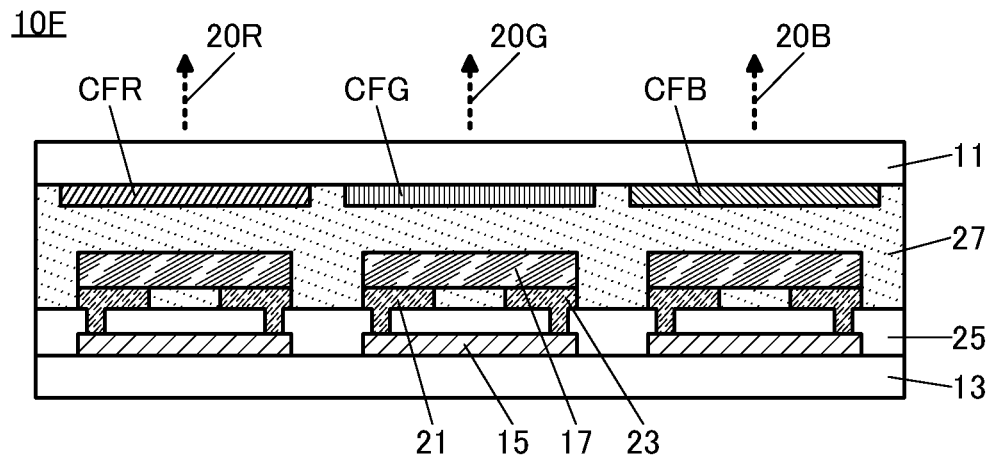
FIG. 5 (A), (B), (C) Structure examples of a display device.

FIG. 5(A) shows an example of a cross-sectional structure of a display device of one embodiment of the present invention. A display device 10F shown in FIG. 5(A) includes, between the substrate 11 and the substrate 13, the functional layer 15, the light-emitting element 17, the coloring layer CFR, the coloring layer CFG, the coloring layer CFB, and the like. The display device 10F is different from the display devices shown in FIG. 1(A) to FIG. 1(C) and FIG. 2(A) to FIG. 2(C) mainly in that the phosphor layer 35 and the light-blocking layer 33 are not included. In FIG. 5(A), the substrate 11 side corresponds to the display surface side of the display device 10.

The LED package 50 includes the reflector 53 and thus has improved light directivity; thus, in the case where the LED package 50 is used as the light-emitting element 17, light leakage to an adjacent pixel and mixture of colors between pixels can be inhibited even when the light-blocking layer 33 is not provided. In addition, when the LED package 50 emitting white light is used as the light-emitting element 17, color display can be performed even when the phosphor layer 35 is not provided.

FIG. 5(A) shows the case where there is a gap between the light-emitting element 17 and each of the coloring layer CFR, the coloring layer CFG, and the coloring layer CFB; however, one embodiment of the present invention is not limited thereto. The coloring layer CFR, the coloring layer CFG, and the coloring layer CFB may be in contact with the light-emitting element 17. Such a structure reduces the distance between the light-emitting element 17 and each of the coloring layer CFR, the coloring layer CFG, and the coloring layer CFB, thereby inhibiting light leakage to an adjacent pixel and mixture of colors between pixels.

Figure 5B:
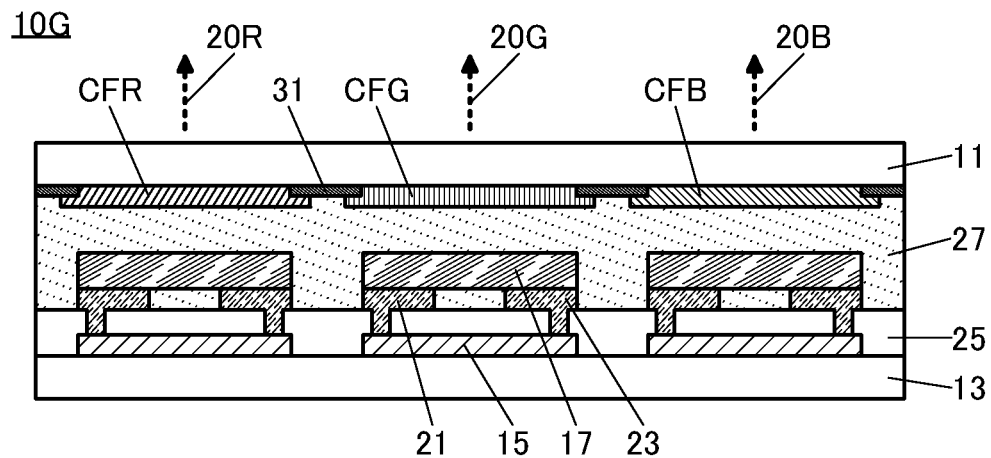

The light-blocking layer 31 may be provided as in a display device 10G shown in FIG. 5(B). The light-blocking layer 31 is provided between adjacent coloring layers. The light-blocking layer 31 includes an opening in a region overlapping with the light-emitting element 17. The light-blocking layer 31 blocks light emitted from an adjacent light-emitting element 17 and inhibits mixture of colors between adjacent light-emitting elements 17. Here, light leakage can be inhibited when end portions of each of the coloring layer CFR, the coloring layer CFG, and the coloring layer CFB are provided so as to overlap with the light-blocking layer 31. For the light-blocking layer 31, a material that blocks light from the light-emitting element 17 can be used; for example, a metal material or a resin material containing pigment or dye can be used.

Figure 5C:
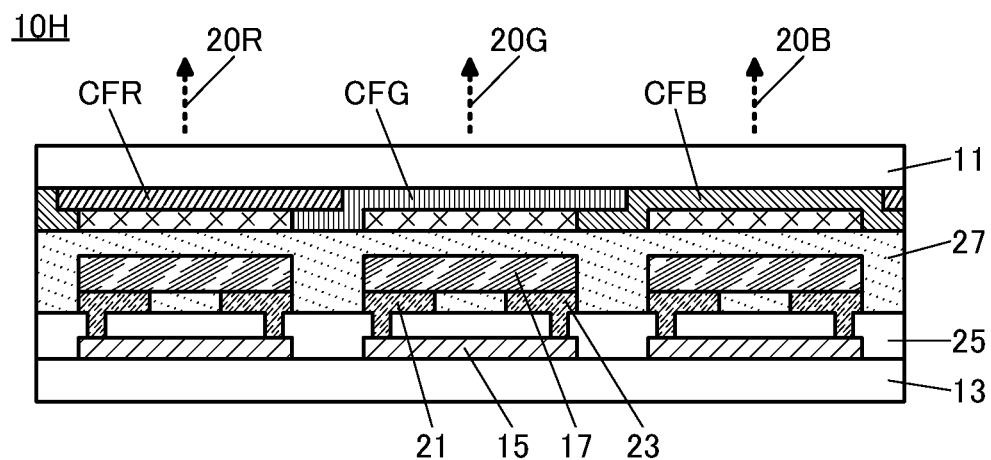

As in a display device 10H shown in FIG. 5(C), each of the coloring layers may be configured to partly overlap with an adjacent coloring layer. A region where the coloring layers overlap functions as a light-blocking layer. Note that one embodiment of the present invention is not limited to the example shown in FIG. 5(C) in which one end portion of the coloring layer CFR overlaps with one end portion of the coloring layer CFG, the other end portion of the coloring layer CFG overlaps with one end portion of the coloring layer CFB, and the other end portion of the coloring layer CFB overlaps with the other end portion of the coloring layer CFR.

A structure in which a pixel not including a coloring layer is further formed and white light is emitted from the pixel can be employed. With such a structure, one color can be expressed by four subpixels of R (red), G (green), B (blue), and W (white). Such a structure allows a smaller amount of current to flow through the light-emitting element 17 than the structure in which one color is expressed by three subpixels of red (R), green (G), and blue (B), so that a display device with low power consumption can be achieved.

The above is the description of the structure examples.

At least part of this embodiment can be implemented in appropriate combination with the other embodiments described in this specification.

Embodiment 2

In this embodiment, examples of the display device illustrated in the above embodiment will be described in detail.

Structure Example

Figure 6A:
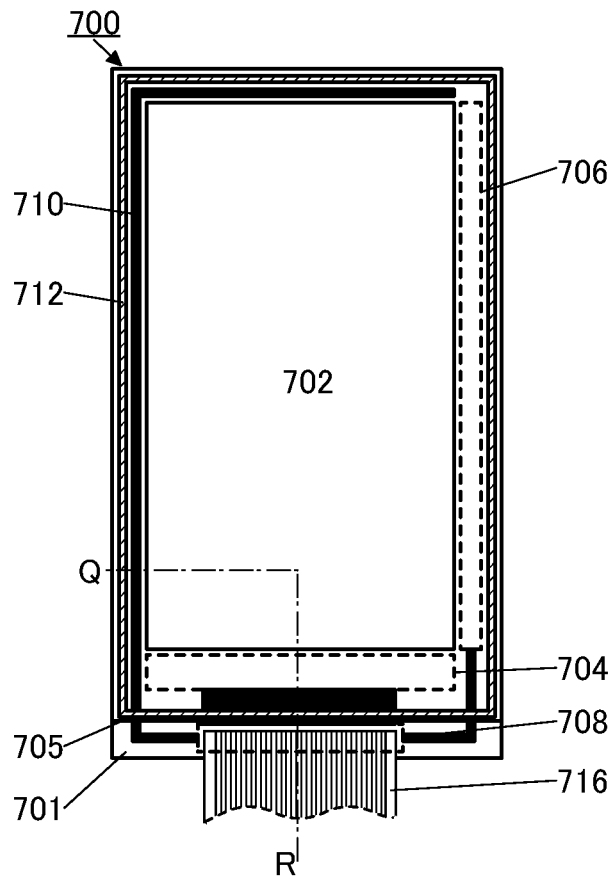
FIG. 6 (A), (B), (C) Top views of display devices.

FIG. 6(A) is a top view of a display device 700. The display device 700 includes a first substrate 701 and a second substrate 705 that are bonded to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

There is no particular limitation on the structure of a transistor included in the pixel portion 702, the source driver circuit portion 704, and the gate driver circuit portion 706. For a semiconductor layer of the transistor, a single crystal semiconductor, a polycrystalline semiconductor, a microcrystalline semiconductor, an amorphous semiconductor, or the like can be used alone or in combination. As a semiconductor material, silicon, germanium, or the like can be used, for example. A compound semiconductor such as silicon germanium, silicon carbide, gallium arsenide, an oxide semiconductor, or a nitride semiconductor, an organic semiconductor, or the like can also be used.

In the case where an organic semiconductor is used for the semiconductor layer, a low molecular organic material having an aromatic ring, a π-electron conjugated conductive high molecule, or the like can be used. For example, rubrene, tetracene, pentacene, perylenediimide, tetracyanoquinodimethane, polythiophene, polyacetylene, or polyparaphenylene vinylene can be used.

The transistor used in this embodiment preferably includes a highly purified oxide semiconductor film in which formation of oxygen vacancies is inhibited. Such a transistor can have a low off-state current. Hence, an electrical signal such as an image signal can be held for a longer time, and the interval between writings can also be set longer in a power on state. As a result, the frequency of refresh operations can be reduced, resulting in an effect of reducing power consumption.

The transistor used in this embodiment can have relatively high field-effect mobility and thus is capable of high-speed operation. For example, with the use of such a transistor capable of high-speed operation for a display device, a switching transistor in a pixel portion and a driver transistor used in a driver circuit portion can be formed over one substrate. That is, a structure without a driver circuit formed using a silicon wafer or the like can also be employed, in which case the number of components of the semiconductor device can be reduced. Moreover, when the transistors capable of high-speed operation are used also in the pixel portion, a high-quality image can be provided.

Figure 6B:
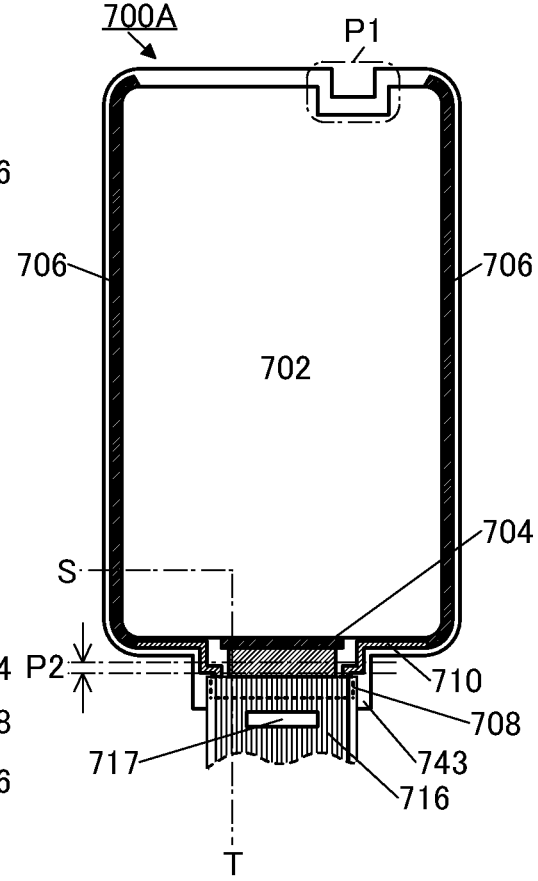

A display device 700A shown in FIG. 6(B) is an example of a display device which includes a flexible resin layer 743 instead of the first substrate 701 and can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as shown in a region P1 in FIG. 6(B). A pair of gate driver circuit portions 706 is provided on the opposite sides with the pixel portion 702 therebetween. The gate driver circuit portions 706 are provided along a curved outline at the corners of the pixel portion 702.

The resin layer 743 has a protrusion where the FPC terminal portion 708 is provided. Furthermore, part of the resin layer 743 that includes the FPC terminal portion 708 can be bent backward in a region P2 in FIG. 6(B). When part of the resin layer 743 is bent backward, the display device 700A can be mounted on an electric device while the FPC 716 overlaps with the back side of the pixel portion 702; thus, an electronic device can be downsized.

An IC 717 is mounted on the FPC 716 connected to the display device 700A. The IC 717 functions as a source driver circuit, for example. In this case, the source driver circuit portion 704 in the display device 700A can be configured to include at least one of a protection circuit, a buffer circuit, a demultiplexer circuit, and the like.

Figure 6C:
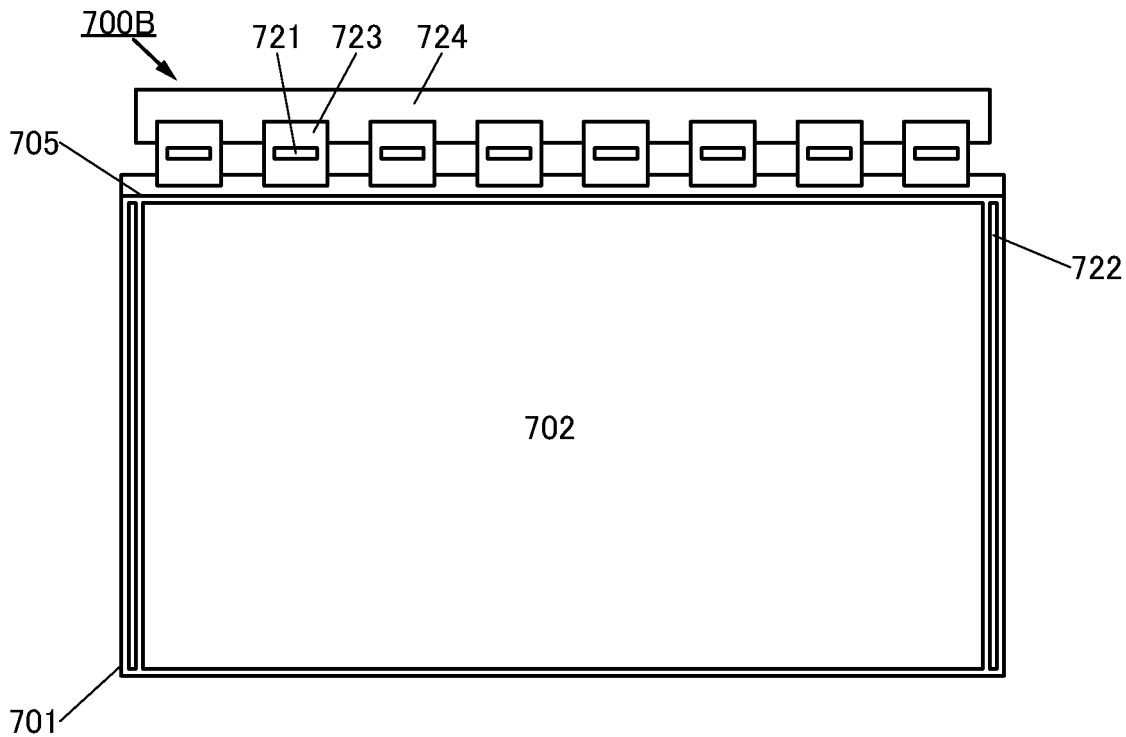

A display device 700B shown in FIG. 6(C) is a display device that can be suitably used for an electronic device with a large screen. For example, the display device 700B can be suitably used for a television device, a monitor device, a personal computer (including a laptop type and a desktop type), a tablet terminal, digital signage, or the like.

The display device 700B includes a plurality of source driver ICs 721 and a pair of gate driver circuit portions 722.

The plurality of source driver ICs 721 are attached to the respective FPCs 723. In each of the plurality of FPCs 723, one of terminals is connected to the substrate 701, and the other terminal is connected to a printed circuit board 724. By bending the FPCs 723, the printed circuit board 724 can be arranged on the back side of the pixel portion 702 so that the display device can be mounted on an electric device; thus, the electronic device can be downsized.

By contrast, the gate driver circuit portions 722 are provided over the substrate 701. Thus, an electronic device with a narrow bezel can be achieved.

With such a structure, a large-size and high-resolution display device can be achieved. For example, use in a display device with a screen diagonal of 30 inches or more, 40 inches or more, 50 inches or more, or 60 inches or more can be achieved. Furthermore, a display device with extremely high resolution such as 4K2K or 8K4K can be achieved.

Cross-Sectional Structure Example 1

Figure 7:
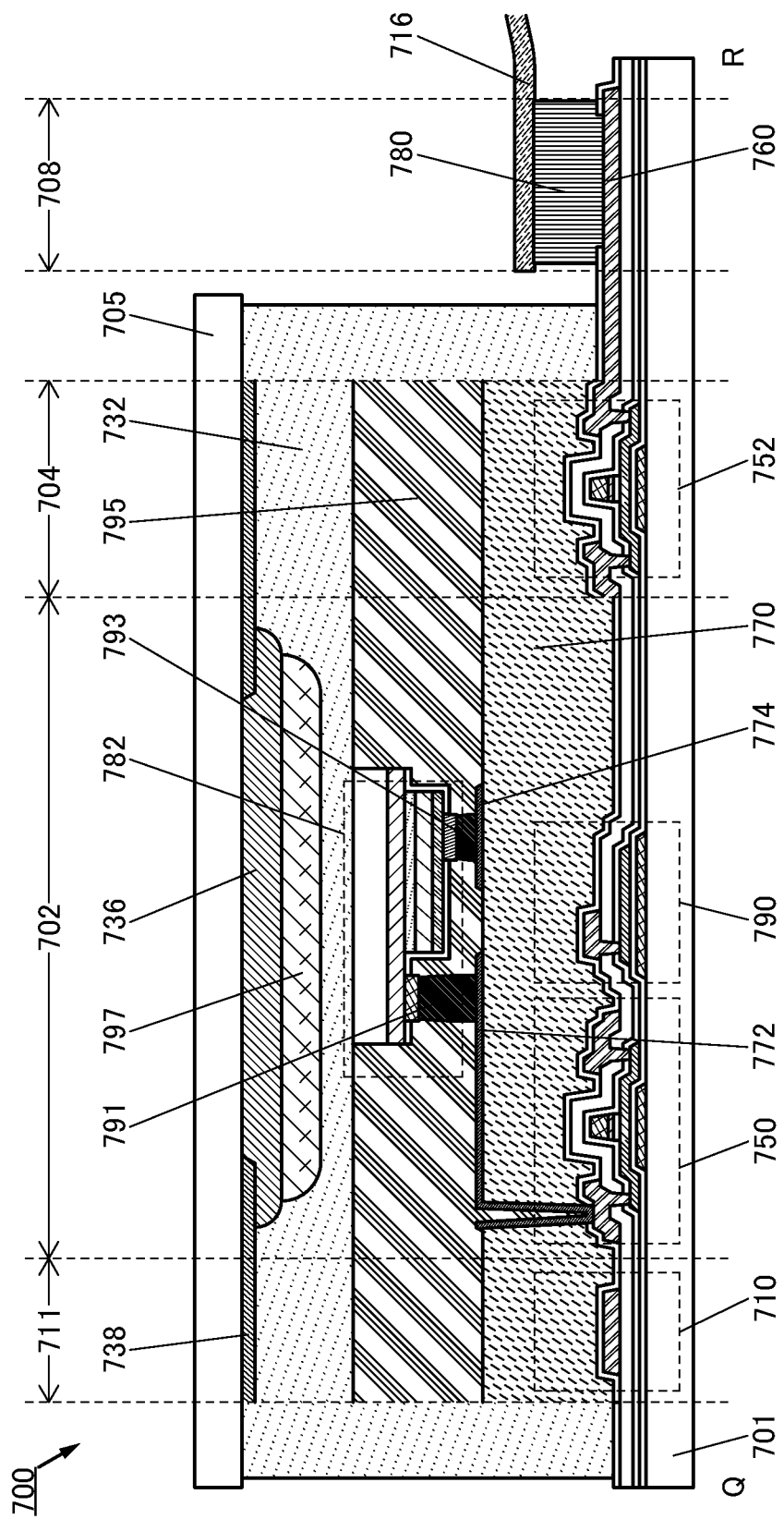
FIG. 7 A cross-sectional view of a display device.

FIG. 7 is a cross-sectional view taken along dashed-dotted line Q-R in FIG. 6(A).

The display devices in FIG. 6 and FIG. 7 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The capacitor 790 shown in FIG. 7 includes a lower electrode formed by processing a film used for the first gate electrode of the transistor 750 and an upper electrode formed by processing a metal oxide film used for the semiconductor layer. The resistance of the upper electrode is reduced as those of a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing a film used for a source electrode and a drain electrode of the transistor is connected to the upper electrode.

An insulating layer 770 is provided over the transistor 750, the transistor 752, and the capacitor 790. The insulating layer 770 functions as a planarization film, so that top surfaces of a conductive layer 772 and a conductive layer 774 provided over the insulating layer 770 can be made flat. The conductive layer 772 and the conductive layer 774 are positioned on the same plane and have the flat top surfaces, which facilitates electrical connection of the conductive layer 772 and the conductive layer 774 to a light-emitting element 782.

The conductive layer 772 and the conductive layer 774 are electrically connected to the light-emitting element 782 through a bump 791 and a bump 793 each having conductivity. FIG. 7 shows a structure in which a cathode-side electrode and an anode-side electrode of the light-emitting element 782 have different heights and the bump 791 and the bump 793 have different heights accordingly. Note that in the case where the cathode-side electrode and the anode-side electrode of the light-emitting element 782 have the same height, the bump 791 and the bump 793 can have substantially the same height.

As shown in FIG. 7, the transistor 750 included in the pixel portion 702 is preferably provided under and overlapping with the conductive layer 772. When the transistor 750, particularly a channel formation region, has a region overlapping with the conductive layer 772, light emitted from the light-emitting element 782 and external light can be inhibited from reaching the transistor 750, so that a change in the electrical characteristics of the transistor 750 can be inhibited.

The transistor 750 included in the pixel portion 702 and the transistor 752 included in the source driver circuit portion 704 may have different structures. For example, a top-gate transistor may be used as one of the transistors and a bottom-gate transistor may be used as the other. Note that the gate driver circuit portion 706 is similar to the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

On the second substrate 705 side, a light-blocking layer 738, a coloring layer 736, and a phosphor layer 797 are provided. The coloring layer 736 is provided over the light-emitting element 782. The phosphor layer 797 is provided between the light-emitting element 782 and the coloring layer 736. The phosphor layer 797, the light-emitting element 782, and the coloring layer 736 include a region in which they overlap with one another. It is preferable that, as shown in FIG. 7, end portions of the phosphor layer 797 be positioned on outer sides than end portions of the light-emitting element 782 and end portions of the coloring layer 736 be positioned on outer sides than end portions of the phosphor layer 797. With such a structure, light leakage to an adjacent pixel and mixture of colors between pixels can be inhibited. In addition, when the light-blocking layer 738 is provided between adjacent coloring layers 736, reflection of external light can be reduced to offer a display device with a high contrast.

For example, when the phosphor layer 797 includes a phosphor emitting yellow light and the light-emitting element 782 emits blue light, white light is emitted from the phosphor layer 797. Light emitted from the light-emitting element 782 that is provided in a region overlapping with the coloring layer 736 transmitting red light passes through the phosphor layer 797 and the coloring layer 736 and is emitted to the display surface side as red light. In the same way, light emitted from the light-emitting element 782 that is provided in a region overlapping with the coloring layer 736 transmitting green light is emitted as green light. Light emitted from the light-emitting element 782 that is provided in a region overlapping with the coloring layer 736 transmitting blue light is emitted as blue light. As a result, color display can be performed with a type of light-emitting element 782. The display device using one type of light-emitting element 782 can be fabricated in a simple process. That is, according to one embodiment of the present invention, a display device with a high luminance, a high contrast, a high response speed, and low power consumption can be obtained at a low manufacturing cost.

For example, a structure in which white light is emitted from the phosphor layer 797 can be obtained when the phosphor layer 797 includes a phosphor emitting red light and the light-emitting element 782 emits blue-green light.

Alternatively, a structure in which white light is emitted from the phosphor layer 797 can be obtained when the phosphor layer 797 includes a phosphor emitting red light, a phosphor emitting green light, and a phosphor emitting blue light and the light-emitting element 782 emits near-ultraviolet light or violet light.

The display device 700 shown in FIG. 7 includes the light-emitting element 782. As the light-emitting element 782, the LED chip illustrated in FIG. 3, which has a horizontal structure and is of a face-down type, is preferably used.

The coloring layer 736 is provided to overlap with the light-emitting element 782, and the light-blocking layer 738 is provided in the lead wiring portion 711, the source driver circuit portion 704, and a position overlapping with the end portions of the coloring layer 736. The space between the light-emitting element 782 and each of the phosphor layer 797, the coloring layer 736, and the light-blocking layer 738 is filled with a sealing film 732.

A light-blocking layer 795 is provided so as to be adjacent to the light-emitting element 782. The light-blocking layer 795 is preferably provided between adjacent light-emitting elements 782. The light-blocking layer 795 provided between the adjacent light-emitting elements 782 can inhibit light leakage to an adjacent pixel and mixture of colors between pixels. A resin containing pigment, dye, carbon black, or the like can be used for the light-blocking layer 795. Furthermore, a side surface of the light-emitting element 782 is preferably in contact with the light-blocking layer 795. When the side surface of the light-emitting element 782 is covered with the light-blocking layer 795, light leakage to an adjacent pixel and mixture of colors between pixels can be inhibited. Note that one embodiment of the present invention is not limited to the structure shown in FIG. 7 in which the level of the top surface of the light-blocking layer 795 is approximately equal to the level of the top surface of the light-emitting element 782. The level of the top surface of the light-blocking layer 795 may be lower than the level of the top surface of the light-emitting element 782 or higher than the level of the top surface of the light-emitting element 782. When the level of the top surface of the light-blocking layer 795 is approximately equal to or higher than the level of the top surface of the light-emitting element 782, light leakage to an adjacent pixel and mixture of colors between pixels can be inhibited efficiently.

Figure 8:
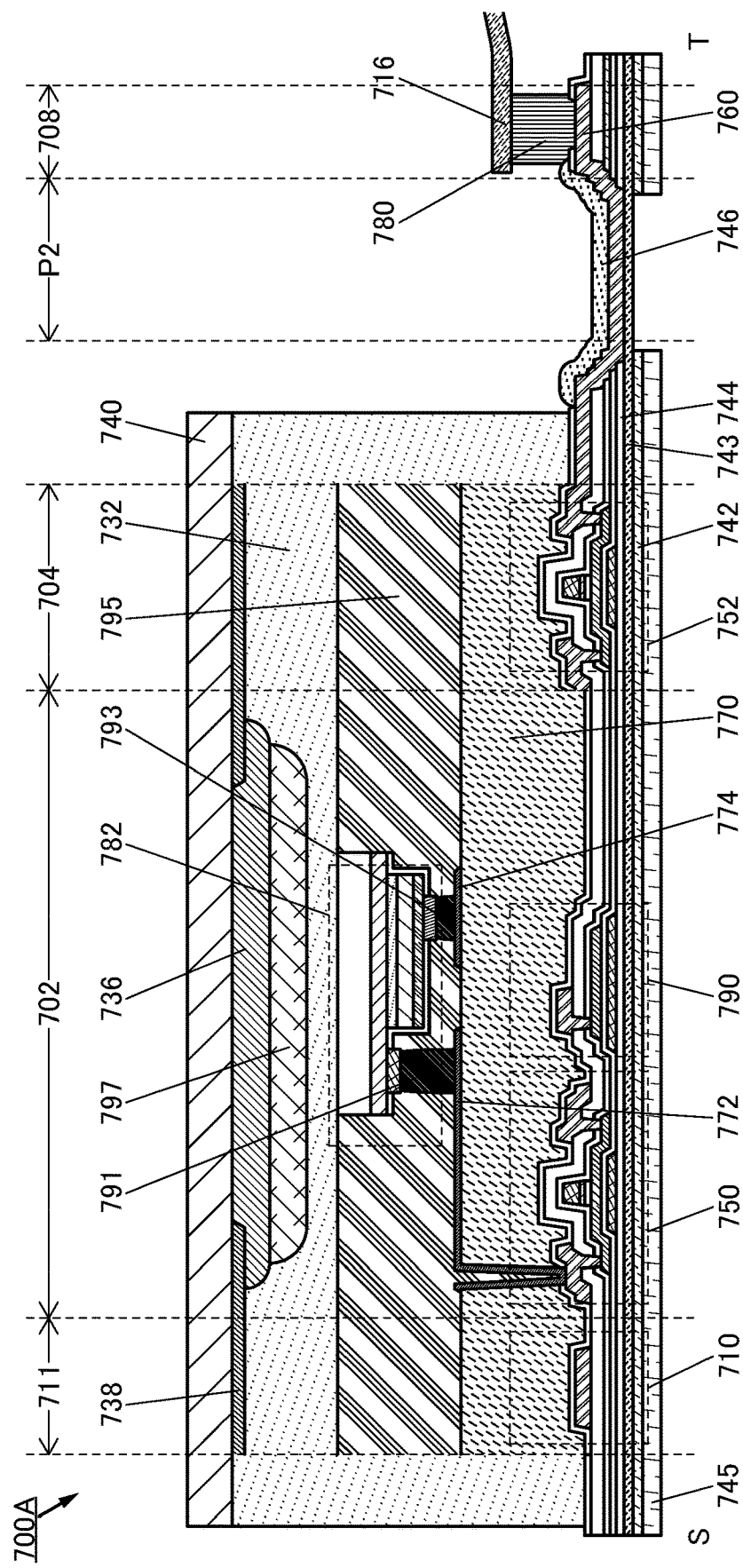
FIG. 8 A cross-sectional view of a display device.

FIG. 8 shows a structure of a display device suitably applicable to a flexible display. FIG. 8 is a cross-sectional view taken along the dashed-dotted line S-T in the display device 700A shown in FIG. 6(B).

The display device 700A shown in FIG. 8 has a structure in which a support substrate 745, an adhesive layer 742, the resin layer 743, and an insulating layer 744 are stacked instead of the substrate 701 shown in FIG. 7. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are bonded to each other with the adhesive layer 742. The resin layer 743 is preferably thinner than the support substrate 745.

The display device 700A shown in FIG. 8 includes a protective layer 740 instead of the substrate 705 shown in FIG. 7. The protective layer 740 is bonded to the sealing film 732. A glass substrate, a resin film, or the like can be used as the protective layer 740. Alternatively, as the protective layer 740, an optical member such as a scattering plate, an input device such as a touch sensor panel, or a structure in which two or more of the above are stacked may be employed.

FIG. 8 shows the region P2 that can be bent. The region P2 includes a portion where the support substrate 745, the adhesive layer 742, and the inorganic insulating film such as the insulating layer 744 are not provided. In the region P2, a resin layer 746 is provided to cover the wiring 760. When an inorganic insulating film is not provided in the region P2 that can be bent and only a conductive layer including a metal or an alloy and a layer including an organic material are stacked, generation of cracks at the time of bending can be prevented. When the support substrate 745 is not provided in the region P2, part of the display device 700A can be bent with an extremely small radius of curvature.

An example of a method for manufacturing the display device 700 shown in FIG. 7 will be described. Each of the drawings shown in FIG. 9 to FIG. 12 is a schematic cross-sectional view of each step in a process of the manufacturing method of the display device 700.

Note that thin films that form the display device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As an example of the thermal CVD method, a metal organic chemical vapor deposition (MOCVD) method may be used.

The thin films that form the display device (insulating films, semiconductor films, conductive films, and the like) can be formed by a method such as spin coating, dipping, spray coating, ink-jetting, dispensing, screen printing, or offset printing, or with a tool (equipment) such as a doctor knife, a slit coater, a roll coater, a curtain coater, or a knife coater.

When the thin films that form the display device are processed, a photolithography method or the like can be used for the processing. Alternatively, island-shaped thin films may be formed by a film formation method using a blocking mask. Alternatively, a nanoimprinting method, a sandblasting method, a lift-off method, or the like may be used for the processing of the thin films. The following two examples of a photolithography method can be given. In one method, a photosensitive resist material is applied onto a thin film to be processed and exposed to light through a photomask; development is performed to form a resist mask; the thin film is processed by etching or the like; then, the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultra-violet (EUV) light or X-rays may be used. Instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

<Formation of Transistor and the Like>

First, a conductive layer 301, a conductive layer 303, and a conductive layer 305 are formed over the substrate 701. The conductive layer 301, the conductive layer 303, and the conductive layer 305 can be formed in such a manner that a conductive film is formed, a resist mask is formed, the conductive film is etched, and then the resist mask is removed.

Then, an insulating layer 311 is formed to cover the substrate 701, the conductive layer 301, the conductive layer 303, and the conductive layer 305.

Then, a semiconductor layer 321, a semiconductor layer 323, and a semiconductor layer 325 are formed (FIG. 9(A)). The semiconductor layer 321, the semiconductor layer 323, and the semiconductor layer 325 can be formed in such a manner that a semiconductor film is formed, a resist mask is formed, the semiconductor film is etched, and then the resist mask is removed.

Then, an insulating layer 331, a conductive layer 341, a conductive layer 351, an insulating layer 333, a conductive layer 343, and a conductive layer 353 are formed. These layers can be formed in such a manner that an insulating film to be the insulating layer 331 and the insulating layer 333, a conductive film to be the conductive layer 341 and the conductive layer 343, and a conductive film to be the conductive layer 351 and the conductive layer 353 are formed, a resist mask is formed, the insulating film and the conductive film are etched, and then the resist mask is removed.

Then, an insulating layer 361 and an insulating layer 363 are formed (FIG. 9(B)).

Then, openings are formed in the insulating layer 361 and the insulating layer 363 to form a conductive layer 371, a conductive layer 373a, a conductive layer 373b, a conductive layer 375, a conductive layer 377, and the wiring 760. The conductive layer 371, the conductive layer 373a, the conductive layer 373b, the conductive layer 375, the conductive layer 377, and the wiring 760 can be formed in a manner similar to that for forming the conductive layer 301 or the like.

Through the above steps, the signal line 710, the transistor 750, the capacitor 790, and the transistor 752 can be formed (FIG. 9(C)). Then, an insulating layer 379 is formed. The insulating layer 379 functions as a protective film of the transistor 750 and the like.

<Formation of Insulating Layer 770>

Then, the insulating layer 770 is formed. When a photosensitive material is used for the insulating layer 770, an opening can be formed by a photolithography method or the like. Note that the opening may be formed in such a manner that an insulating film is formed as the insulating layer 770 and then part of the insulating film is etched with use of a resist mask. An organic insulating material is preferably used for the insulating layer 770 to improve the flatness of the top surface thereof.

Alternatively, an inorganic insulating film may be used for the insulating layer 770. The insulating layer 770 can be formed using a single layer or stacked layers of any of layers of inorganic insulating materials such as silicon nitride, silicon oxide, silicon oxynitride, silicon nitride oxide, aluminum oxide, aluminum nitride, aluminum oxynitride, and aluminum nitride oxide. Thus, the insulating layer 770 functions as a protective layer of the transistor 750 and the like.

Alternatively, the insulating layer 770 may have a stacked-layer structure of an inorganic insulating film and an organic insulating film.

Then, part of the insulating layer 379 over the wiring 760 in the FPC terminal portion 708 is removed to expose the wiring 760.

<Formation of Conductive Layer 772 and Conductive Layer 774>

Then, the conductive layer 772 and the conductive layer 774 are formed over the insulating layer 770 (FIG. 10(A)). The conductive layer 772 is electrically connected to the transistor 750 through the opening included in the insulating layer 770. The conductive layer 772 and the conductive layer 774 can be formed in a manner similar to that for forming the conductive layer 301 or the like. A light-reflecting material is preferably used for the conductive layer 772 and the conductive layer 774. For example, a material containing an alloy of silver, palladium, and copper (also referred to as APC), aluminum, titanium, copper, or the like can be used for the conductive layer 772 and the conductive layer 774.

Then, the bump 791 and the bump 793 each having conductivity are formed over the conductive layer 772 and the conductive layer 774, respectively (FIG. 10(B)). For the bump 791 and the bump 793, a metal such as gold, silver, or tin, an alloy containing any of these metals, an anisotropic conductive film made of a conductive resin or the like, or conductive paste can be used. For example, gold can be favorably used for the bump 791 and the bump 793. The bump 791 and the bump 793 can be formed by a printing method, a transfer method, a discharge method, or the like.

<Arrangement of Light-Emitting Element 782>

Then, the light-emitting element 782 is arranged over the bump 791 and the bump 793. As the light-emitting element 782, the face-down type LED chip having a horizontal structure illustrated in FIG. 3 is preferably used. The light-emitting element 782 is arranged so that the cathode-side electrode and the anode-side electrode of the light-emitting element 782 are in contact with the bump 791 and the bump 793, respectively. The bump 791, the bump 793, the light-emitting element 782, the conductive layer 772, and the conductive layer 774 are subjected to pressure bonding, so that the light-emitting element 782 is fixed onto the conductive layer 772 and the conductive layer 774. At the same time, the conductive layer 772 and the conductive layer 774 are electrically connected to the light-emitting element 782 (FIG. 11).

For the arrangement of the light-emitting element 782, a pick-and-place device, which picks up and transfers the light-emitting element 782 from a predetermined position and places it to in predetermined position, can be used. Alternatively, an FSA (Fluidic Self Assembly) system may be used for the arrangement of the light-emitting element 782. In the FSA system, an insulating layer with a depression that fits the light-emitting element 782 is formed over the conductive layer 772 and in a region overlapping with the conductive layer 774, and the light-emitting element 782 is arranged in a depression in liquid in a self-aligned manner. Since one type of LED chip is used as the light-emitting element 782 in one embodiment of the present invention, a light-emitting element 781 can be arranged easily compared to the case where a plurality of kinds of LED chips are used.

<Formation of Light-Blocking Layer 795>

Figure 11:
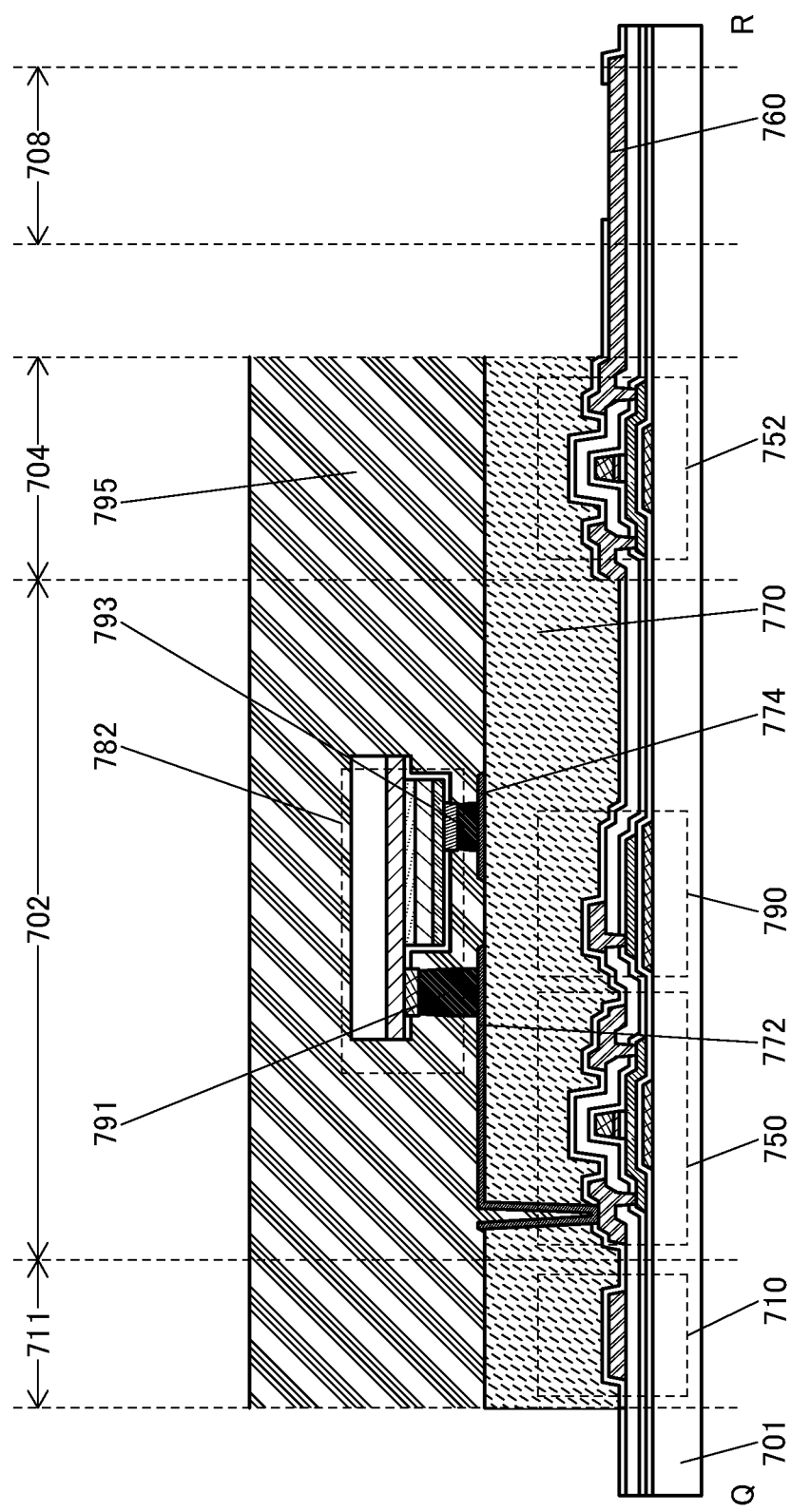
FIG. 11 A diagram illustrating a method for manufacturing a display device.

Then, a light-blocking film to be the light-blocking layer 795 is formed over the insulating layer 770 and the light-emitting element 782 (FIG. 11). The light-blocking film can be formed by a photolithography method or the like using a metal material or a resin containing pigment or dye. At this time, the thickness of the light-blocking film is adjusted so that the light-blocking film is also formed over the light-emitting element 782.

Then, the light-blocking film to be the light-blocking layer 795 is partly removed to expose the top surface of the light-emitting element 782 (FIG. 12(A)). The light-blocking film can be removed by a dry etching method or the like. In one embodiment of the present invention, one type of LED chip is used as the light-emitting element 782 and the levels of the light-emitting elements 782 can be uniform among subpixels, which facilitates uniform exposure of the top surface of each of the light-emitting elements 782 and reduces the manufacturing cost. That is, according to one embodiment of the present invention, a display device with a high luminance, a high contrast, a high response speed, and low power consumption can be obtained at a low manufacturing cost.

<Formation of Coloring Layer 736 and Phosphor Layer 797>

Then, the light-blocking layer 738 and the coloring layer 736 are formed over the substrate 705.

For the light-blocking layer 738, a metal material or a resin material can be used. In the case where a metal material is used, the light-blocking layer 738 can be formed in such a manner that a conductive film is formed and an unnecessary portion is removed by a photolithography method or the like. In the case where a metal material or a photosensitive resin material containing pigment or dye is used, the light-blocking layer 738 can be formed by a photolithography method or the like.

A photosensitive resin material is preferably used for the coloring layer 736, for example. The coloring layer 736 can be formed in such a manner that a material is applied onto the substrate 705 and the light-blocking layer 738 and exposed to light through a photomask, and development and then heat treatment are performed.

Then, the phosphor layer 797 is formed over the coloring layer 736 (FIG. 12(B)). The phosphor layer 797 can be formed by, for example, a screen printing method or a dispensing method using an organic resin layer including a phosphor.

<Bonding of Substrate 701 and Substrate 705>

Then, one or both of the substrate 701 and substrate 705 is/are provided with an adhesive layer for bonding these substrates. The adhesive layer is formed to surround a region where a pixel is arranged. The adhesive layer can be formed by a screen printing method, a dispensing method, or the like. A heat curable resin or an ultraviolet curable resin can be used for the adhesive layer. It is also possible to use a resin or the like that is cured when heated after pre-cured by ultraviolet light. Alternatively, a thermosetting and ultraviolet curable resin or the like may be used for the adhesive layer.

Then, the substrate 701 and the substrate 705 are bonded to each other, and the adhesive layer is cured to form the sealing film 732. The bonding is preferably performed in a reduced-pressure atmosphere because air bubbles and the like can be prevented from entering a region between the substrate 701 and the substrate 705.

Then, the anisotropic conductive film 780 is provided over the wiring 760. The FPC 716 is arranged over the anisotropic conductive film 780 and thermocompression bonding is performed, whereby the wiring 760 and the FPC 716 are electrically connected to each other.

Through the above steps, the display device 700 can be formed (FIG. 7).

Cross-Sectional Structure Example 2

Figure 13:
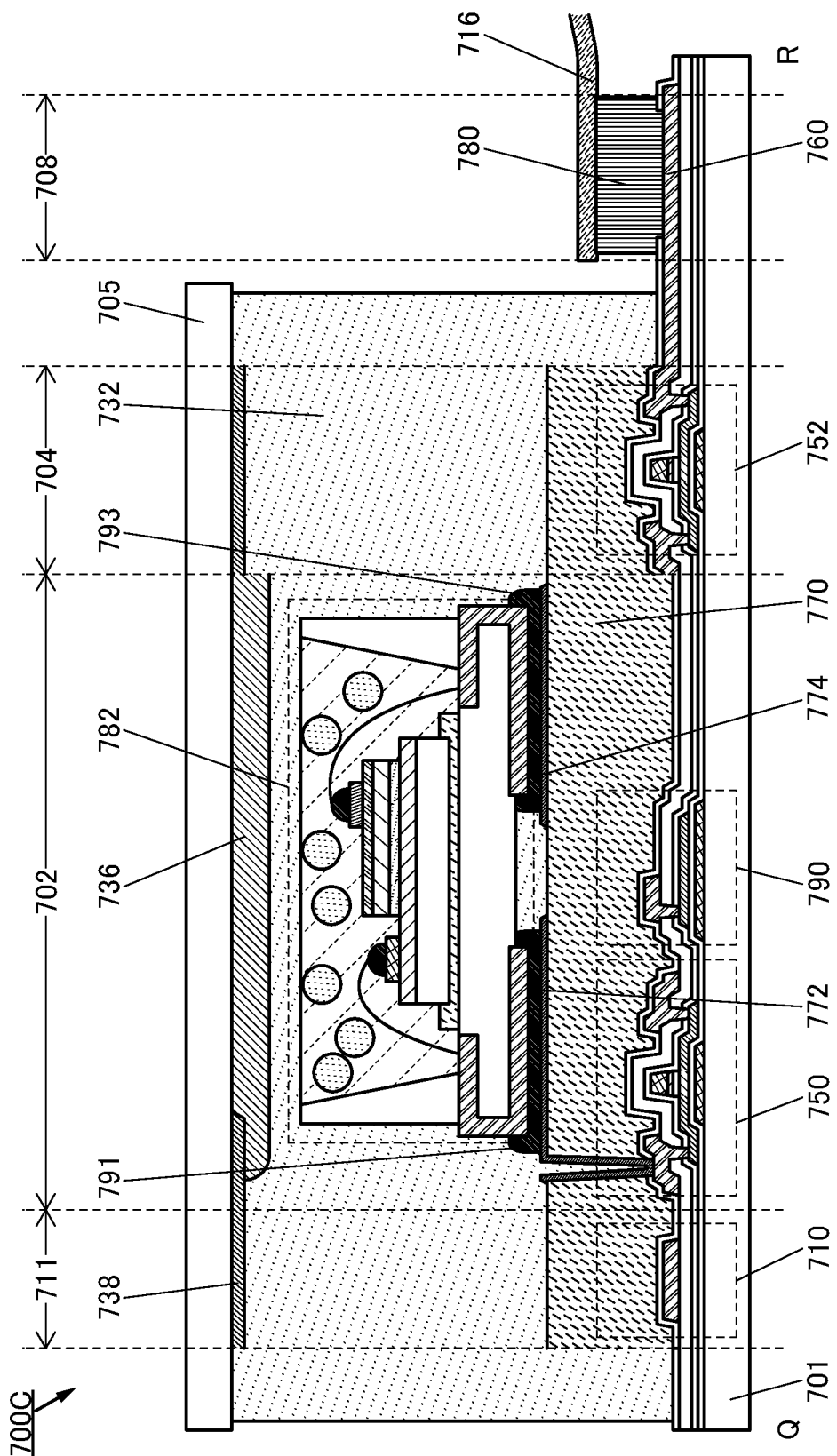
FIG. 13 A cross-sectional view of a display device.

FIG. 13 shows another structure example of the display device 700 shown above. FIG. 13 is a cross-sectional view taken along dashed-dotted line Q-R in FIG. 7(A). A display device 700C shown in FIG. 13 is different from the display device 700 shown in FIG. 7 mainly in that the LED package illustrated in FIG. 4 is included as the light-emitting element 782 and the light-blocking layer 795 and the phosphor layer 797 are not included.

An example of a method for manufacturing the display device 700C shown in FIG. 13 will be described with reference to FIG. 14 and FIG. 15. Each of the drawings shown in FIG. 14 and FIG. 15 is a schematic cross-sectional view of each step in a process of the manufacturing method of the display device 700C. For the steps up to the formation of the insulating layer 770, the above description of the manufacturing method of the display device 700 can be referred to, and thus, detailed description is omitted.

<Formation of Conductive Layer 772 and Conductive Layer 774>

The conductive layer 772 and the conductive layer 774 are formed over the insulating layer 770 (FIG. 14(A)). The conductive layer 772 is electrically connected to the transistor 750 through the opening included in the insulating layer 770. The conductive layer 772 and the conductive layer 774 can be formed in a manner similar to that for forming the conductive layer 301 or the like.

Then, the bump 791 and the bump 793 each having conductivity are formed over the conductive layer 772 and the conductive layer 774, respectively (FIG. 14(B)). For the bump 791 and the bump 793, a metal such as gold, silver, or tin, an alloy containing any of these metals, an anisotropic conductive film such as a conductive resin, or conductive paste can be used. The bump 791 and the bump 793 can be formed by a printing method, a transfer method, a discharge method, or the like.

For example, silver paste can be used for the bump 791 and the bump 793, and any one of more of APC, aluminum, titanium, and copper can be used for the conductive layer 772 and the conductive layer 774. Such a structure allows the light-emitting element 782 to be electrically connected to each of the conductive layer 772 and the conductive layer 774 favorably.

<Arrangement of Light-Emitting Element 782>

Then, the light-emitting element 782 is arranged over the bump 791 and the bump 793. As the light-emitting element 782, the surface mount type LED package illustrated in FIG. 4 is preferably used. The light-emitting element 782 is arranged so that the cathode-side electrode and the anode-side electrode of the light-emitting element 782 are in contact with the bump 791 and the bump 793, respectively. The bump 791, the bump 793, the light-emitting element 782, the conductive layer 772, and the conductive layer 774 are subjected to pressure bonding, so that the light-emitting element 782 is fixed onto the conductive layer 772 and the conductive layer 774. At the same time, the conductive layer 772 and the conductive layer 774 are electrically connected to the light-emitting element 782 (FIG. 15(A)).

For the arrangement of the light-emitting element 782, a pick-and-place device can be used. Alternatively, an FSA system may be used for the arrangement of the light-emitting element 782. Since one type of LED chip is used as the light-emitting element 782 in one embodiment of the present invention, a light-emitting element 781 can be arranged easily compared to the case where a plurality of kinds of LED chips are used.

<Formation of Coloring Layer>

Then, the light-blocking layer 738 and the coloring layer 736 are formed over the substrate 705 (FIG. 15(B)). For the light-blocking layer 738 and the coloring layer 736, the above description of the manufacturing method of the display device 700 can be referred to, and thus, detailed description is omitted.

<Bonding of Substrate 701 and Substrate 705>

Then, one or both of the substrate 701 and substrate 705 is/are provided with an adhesive layer for bonding these substrates. For the bonding of the substrate 701 and substrate 705, the above description of the manufacturing method of the display device 700 can be referred to, and thus, detailed description is omitted.

Then, the anisotropic conductive film 780 is provided over the wiring 760. The FPC 716 is arranged over the anisotropic conductive film 780 and thermocompression bonding is performed, whereby the wiring 760 and the FPC 716 are electrically connected to each other.

Through the above steps, the display device 700C can be formed (FIG. 13).

Structure Example of Display Device Provided with Input Device

An input device may be provided in the display device shown in FIG. 7, FIG. 8, and FIG. 13. An example of the input device includes a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include a so-called in-cell touch panel in which an input device is provided inside a pair of substrates, a so-called on-cell touch panel in which an input device is formed over the display device 700, and a so-called out-cell touch panel in which an input device is attached to the display device 700.

At least part of this embodiment can be implemented in appropriate combination with the other embodiments described in this specification.

Embodiment 3

In this embodiment, an example of a transistor that can be used for the display device described in the above embodiments will be described.

The display device of one embodiment of the present invention can be fabricated using a transistor with any of various structures, such as a bottom-gate transistor or a top-gate transistor. Therefore, a material for a semiconductor layer or the structure of a transistor can be easily changed depending on the existing production line.

<Bottom-Gate Transistor>

FIG. 16(A1) is a cross-sectional view in the channel length direction of a channel-protective transistor 1810, which is a type of bottom-gate transistor. In FIG. 16(A1), the transistor 1810 is formed over a substrate 1771. The transistor 1810 includes an electrode 1746 over the substrate 1771 with an insulating layer 1772 therebetween. The transistor 1810 also includes a semiconductor layer 1742 over the electrode 1746 with an insulating layer 1726 therebetween. The electrode 1746 can function as a gate electrode. The insulating layer 1726 can function as a gate insulating layer.

Furthermore, an insulating layer 1741 is provided over a channel formation region in the semiconductor layer 1742. An electrode 1744a and an electrode 1744b are provided over the insulating layer 1726 so as to be in contact with part of the semiconductor layer 1742. The electrode 1744a can function as one of a source electrode and a drain electrode. The electrode 1744b can function as the other of the source electrode and the drain electrode. Part of the electrode 1744a and part of the electrode 1744b are formed over the insulating layer 1741.

The insulating layer 1741 can function as a channel protective layer. With the insulating layer 1741 provided over the channel formation region, the semiconductor layer 1742 can be prevented from being exposed at the time of forming the electrode 1744a and the electrode 1744b. Thus, the channel formation region in the semiconductor layer 1742 can be prevented from being etched at the time of forming the electrode 1744a and the electrode 1744b. According to one embodiment of the present invention, a transistor with favorable electrical characteristics can be provided.

The transistor 1810 includes an insulating layer 1728 over the electrode 1744*a*, the electrode 1744*b*, and the insulating layer 1741 and also includes an insulating layer 1729 over the insulating layer 1728.

In the case where an oxide semiconductor is used for the semiconductor layer 1742, a material capable of removing oxygen from part of the semiconductor layer 1742 to generate oxygen vacancies is preferably used at least for portions of the electrode 1744*a* and the electrode 1744*b* that are in contact with the semiconductor layer 1742. The carrier concentration in the regions of the semiconductor layer 1742 where oxygen vacancies are generated is increased, so that the regions become n-type regions ($n^+$ layers). Accordingly, the regions can function as a source region and a drain region. When an oxide semiconductor is used for the semiconductor layer 1742, examples of the material capable of removing oxygen from the semiconductor layer 1742 to generate oxygen vacancies include tungsten and titanium.

Formation of the source region and the drain region in the semiconductor layer 1742 makes it possible to reduce contact resistance between the semiconductor layer 1742 and each of the electrode 1744*a* and the electrode 1744*b*. Accordingly, the electrical characteristics of the transistor, such as the field-effect mobility and the threshold voltage, can be improved.

In the case where a semiconductor such as silicon is used for the semiconductor layer 1742, a layer that functions as an n-type semiconductor or a p-type semiconductor is preferably provided between the semiconductor layer 1742 and the electrode 1744*a* and between the semiconductor layer 1742 and the electrode 1744*b*. The layer that functions as an n-type semiconductor or a p-type semiconductor can function as the source region or the drain region in the transistor.

The insulating layer 1729 is preferably formed using a material that has a function of preventing or reducing diffusion of impurities into the transistor from the outside. Note that the insulating layer 1729 can be omitted as necessary.

A transistor 1811 shown in FIG. 16(A2) is different from the transistor 1810 in that an electrode 1723 that can function as a back gate electrode is provided over the insulating layer 1729. The electrode 1723 can be formed using a material and a method similar to those for the electrode 1746.

In general, a back gate electrode is formed using a conductive layer and arranged so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 1746 and the electrode 1723 can each function as a gate electrode. Thus, the insulating layer 1726, the insulating layer 1728, and the insulating layer 1729 can each function as a gate insulating layer. Note that the electrode 1723 may be provided between the insulating layer 1728 and the insulating layer 1729.

Note that in the case where one of the electrode 1746 and the electrode 1723 is referred to as a "gate electrode", the other is referred to as a "back gate electrode". For example, in the case where the electrode 1723 is referred to as a "gate electrode" in the transistor 1811, the electrode 1746 is referred to as a "back gate electrode". In the case where the electrode 1723 is used as a "gate electrode", the transistor 1811 can be regarded as a kind of top-gate transistor. In some cases, one of the electrode 1746 and the electrode 1723 is referred to as a "first gate electrode" and the other is referred to as a "second gate electrode".

By providing the electrode 1746 and the electrode 1723 with the semiconductor layer 1742 therebetween and setting the potential of the electrode 1746 equal to the potential of the electrode 1723, a region of the semiconductor layer 1742 through which carriers flow is enlarged in the film thickness direction; thus, the number of transferred carriers is increased. As a result, the on-state current of the transistor 1811 is increased and the field-effect mobility is increased.

Therefore, the transistor 1811 is a transistor having high on-state current for its occupation area. That is, the occupation area of the transistor 1811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 16(B1) is a cross-sectional view in the channel length direction of a channel-protective transistor 1820, which has a structure different from the structure in FIG. 16(A1). The transistor 1820 has substantially the same structure as the transistor 1810 but is different from the transistor 1810 in that the insulating layer 1741 covers end portions of the semiconductor layer 1742. The semiconductor layer 1742 is electrically connected to the electrode 1744*a* in an opening portion formed by selectively removing part of the insulating layer 1741 that overlaps with the semiconductor layer 1742. Furthermore, the semiconductor layer 1742 is electrically connected to the electrode 1744*b* in another opening portion formed by selectively removing part of the insulating layer 1741 that overlaps with the semiconductor layer 1742. A region of the insulating layer 1741 that overlaps with the channel formation region can function as a channel protective layer.

A transistor 1821 shown in FIG. 16(B2) is different from the transistor 1820 in that the electrode 1723 that can function as a back gate electrode is provided over the insulating layer 1729.

By providing the insulating layer 1729, the semiconductor layer 1742 can be prevented from being exposed at the time of forming the electrode 1744*a* and the electrode 1744*b*. Thus, the semiconductor layer 1742 can be prevented from being thinned down at the time of forming the electrode 1744a and the electrode 1744b.

The distance between the electrode 1744a and the electrode 1746 and the distance between the electrode 1744b and the electrode 1746 in the transistor 1820 and the transistor 1821 are larger than those in the transistor 1810 and the transistor 1811. Thus, parasitic capacitance generated between the electrode 1744a and the electrode 1746 can be reduced. Moreover, parasitic capacitance generated between the electrode 1744b and the electrode 1746 can be reduced. According to one embodiment of the present invention, a transistor with favorable electrical characteristics can be achieved.

A transistor 1825 shown in FIG. 16(C1) is a cross-sectional view in the channel length direction of a channel-etched transistor 1825, which is a type of bottom-gate transistor. In the transistor 1825, the electrode 1744a and the electrode 1744b are formed without providing the insulating layer 1741. Thus, part of the semiconductor layer 1742 that is exposed at the time of forming the electrode 1744a and the electrode 1744b is etched in some cases. Meanwhile, since the insulating layer 1741 is not provided, the productivity of the transistor can be increased.

A transistor 1826 shown in FIG. 16(C2) is different from the transistor 1825 in that the electrode 1723 that can function as a back gate electrode is provided over the insulating layer 1729.

FIG. 17(A1) to FIG. 17(C2) illustrate cross-sectional views in the channel width direction of the transistors 1810, 1811, 1820, 1821, 1825, and 1826, respectively.

In each of the structures shown in FIG. 17(B2) and FIG. 17(C2), the gate electrode is connected to the back gate electrode, and the gate electrode and the back gate electrode have the same potential. In addition, the semiconductor layer 1742 is interposed between the gate electrode and the back gate electrode.

The length in the channel width direction of each of the gate electrode and the back gate electrode is longer than the length in the channel width direction of the semiconductor layer 1742. In the channel width direction, the whole of the semiconductor layer 1742 is covered with the gate electrode or the back gate electrode with the insulating layers 1726, 1741, 1728, and 1729 interposed therebetween.

With the structure, the semiconductor layer 1742 included in the transistor can be electrically surrounded by electric fields of the gate electrode and the back gate electrode.

A device structure of a transistor, like that of the transistor 1821 or the transistor 1826, in which electric fields of a gate electrode and a back gate electrode electrically surround the semiconductor layer 1742 where a channel formation region is formed can be referred to as a Surrounded channel (S-channel) structure.

With the S-channel structure, an electric field for inducing a channel can be effectively applied to the semiconductor layer 1742 by one or both of the gate electrode and the back gate electrode, which enables improvement in the current drive capability of the transistor and high on-state current characteristics. In addition, since the on-state current can be increased, it is possible to scale down the transistor. Furthermore, with the S-channel structure, the mechanical strength of the transistor can be increased.

<Top-Gate Transistor>

A transistor 1842 illustrated in FIG. 18(A1) is a type of top-gate transistor. The transistor 1842 is different from the transistor 1810 and the transistor 1820 in that the electrode 1744a and the electrode 1744b are formed after the insulating layer 1729 is formed. The electrode 1744a and the electrode 1744b are electrically connected to the semiconductor layer 1742 in opening portions formed in the insulating layer 1728 and the insulating layer 1729.

Part of the insulating layer 1726 that does not overlap with the electrode 1746 is removed, and an impurity is introduced into the semiconductor layer 1742 using the electrode 1746 and the remaining insulating layer 1726 as a mask, so that an impurity region can be formed in the semiconductor layer 1742 in a self-aligned manner. The transistor 1842 includes a region where the insulating layer 1726 extends beyond end portions of the electrode 1746. The semiconductor layer 1742 in a region into which the impurity is introduced through the insulating layer 1726 has a lower impurity concentration than a region into which the impurity is introduced without through the insulating layer 1726. Thus, an LDD (Lightly Doped Drain) region is formed in a region of the semiconductor layer 1742 that does not overlap with the electrode 1746.

A transistor 1843 shown in FIG. 18(A2) is different from the transistor 1842 in that the electrode 1723 is included. The transistor 1843 includes the electrode 1723 formed over the substrate 1771. The electrode 1723 has a region overlapping with the semiconductor layer 1742 with the insulating layer 1772 therebetween. The electrode 1723 can function as a back gate electrode.

As in a transistor 1844 shown in FIG. 18(B1) and a transistor 1845 shown in FIG. 18(B2), the insulating layer 1726 in a region that does not overlap with the electrode 1746 may be completely removed. Alternatively, as in a transistor 1846 shown in FIG. 18(C1) and a transistor 1847 shown in FIG. 18(C2), the insulating layer 1726 may be left.

Also in the transistor 1843 to the transistor 1847, the impurity is introduced into the semiconductor layer 1742 using the electrode 1746 as a mask after the formation of the electrode 1746, so that an impurity region can be formed in the semiconductor layer 1742 in a self-aligned manner. According to one embodiment of the present invention, a transistor with favorable electrical characteristics can be achieved. Furthermore, according to one embodiment of the present invention, a semiconductor device having a high degree of integration can be achieved.

FIG. 19(A1) to FIG. 19(C2) show cross-sectional views in the channel width direction of the transistors 1842, 1843, 1844, 1845, 1846, and 1847, respectively.

The transistor 1843, the transistor 1845, and the transistor 1847 each have the above-described S-channel structure. However, one embodiment of the present invention is not limited to this, and the transistor 1843, the transistor 1845, and the transistor 1847 do not necessarily have the S-channel structure.

Hereinafter, a metal oxide that can be favorably used for a channel formation region of a transistor will be described.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where a metal oxide that constitutes the semiconductor layer is an In-M-Zn-based oxide, it is preferable that the atomic ratio of metal elements in a sputtering target used to deposit an In-M-Zn oxide satisfy In M and Zn M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the formed semiconductor layer varies from the above atomic ratio of metal elements in the sputtering target in a range of ±40%.

A metal oxide film with low carrier density is used as the semiconductor layer. For example, for the semiconductor layer, a metal oxide whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such a metal oxide is referred to as a highly purified intrinsic or substantially highly purified intrinsic metal oxide. The metal oxide has a low impurity concentration and a low density of defect states and can be regarded as a metal oxide having stable characteristics.

Note that the composition is not limited to those, and an oxide semiconductor having an appropriate composition may be used depending on required semiconductor characteristics and electrical characteristics (field-effect mobility, threshold voltage, or the like) of the transistor. In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the metal oxide that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to a metal oxide, in which case the off-state current of the transistor might be increased. Thus, the concentration of alkali metal or alkaline earth metal in the semiconductor layer is set to lower than or equal to $1 \times 10^{18}$ atoms/cm$^3$, preferably lower than or equal to $2 \times 10^{16}$ atoms/cm$^3$.

Furthermore, when nitrogen is contained in the metal oxide that constitutes the semiconductor layer, electrons serving as carriers are generated and the carrier density is increased, so that the semiconductor layer easily becomes n-type. As a result, a transistor using a metal oxide that contains nitrogen is likely to have normally-on characteristics. Therefore, the concentration of nitrogen in the semiconductor layer, which is measured by secondary ion mass spectrometry, is preferably set to lower than or equal to $5 \times 10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS(Cloud-Aligned Composite oxide semiconductor) may be used for a semiconductor layer of a transistor disclosed in one embodiment of the present invention.

The aforementioned non-single-crystal oxide semiconductor or CAC-OS can be suitably used for a semiconductor layer of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a layered structure including two or more of the foregoing regions in some cases.

The composition of a CAC-OS that can be used in a transistor disclosed in one embodiment of the present invention is described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) to form a mosaic pattern, and $InO_{X1}$ or $In_{X2}Zn_{Y2}O_{Z2}$ forming the mosaic pattern is evenly distributed in the film.

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more kinds of films with different atomic compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under the condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in an a-b plane direction and a c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance (a ring region) and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region containing $GaO_{X3}$ or the like as a main component is higher than that of a region containing $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, with the use of the transistor in a signal line driver circuit that is included in a display device (particularly in a demultiplexer connected to an output terminal of a shift register included in a signal line driver circuit), the display device connected to less number of wirings can be provided.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As the silicon, amorphous silicon may be used but silicon having crystallinity is preferably used. For example, microcrystalline silicon, polycrystalline silicon, or single-crystal silicon are preferably used. In particular, polycrystalline silicon can be formed at a temperature lower than that for single crystal silicon and has higher field-effect mobility and higher reliability than amorphous silicon.

At least part of this embodiment can be implemented in appropriate combination with the other embodiments described in this specification.

Embodiment 4

In this embodiment, a display device of one embodiment of the present invention will be described.

Figure 20A:
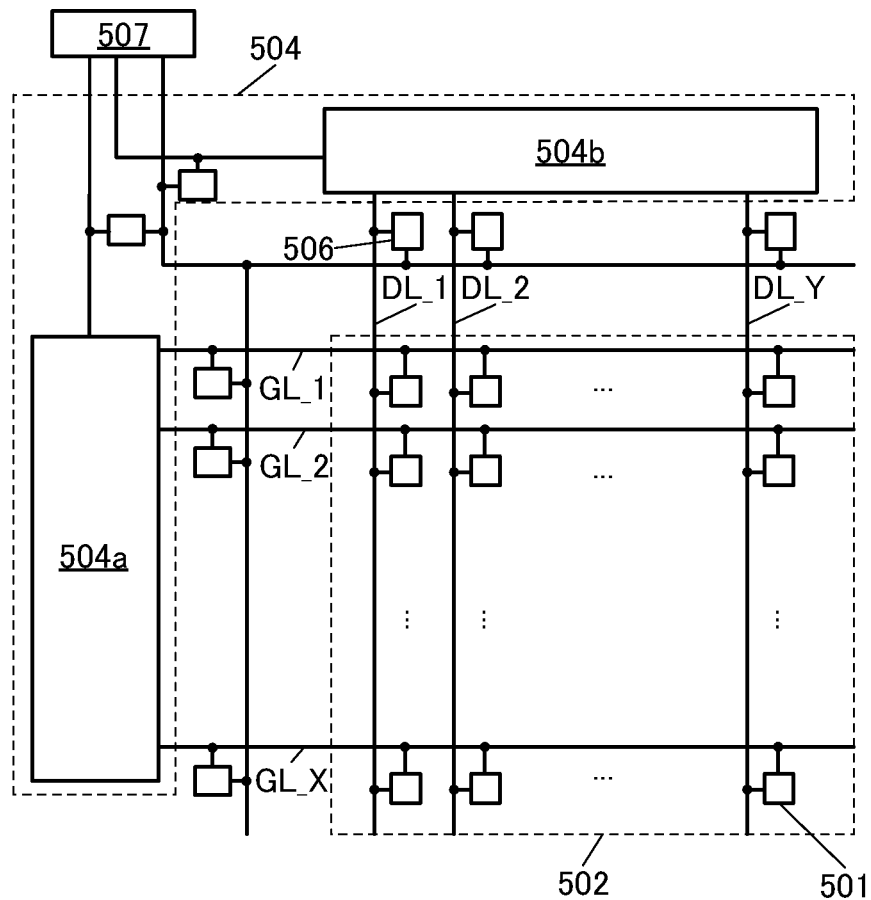
FIG. 20 (A) A block diagram of a display device. (B) A circuit diagram of a display device.

A display device shown in FIG. 20(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 shown in FIG. 20(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 20B:
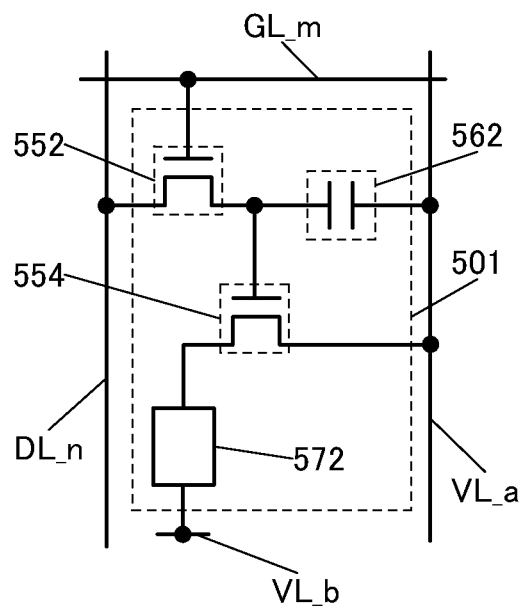

The plurality of pixel circuits 501 shown in FIG. 20(A) can have a configuration shown in FIG. 20(B), for example. The pixel circuit 501 shown in FIG. 20(B) includes a transistor 552, a transistor 554, a capacitor 562, and a light-emitting element 572. A data line DL_n, a scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

Figure 21A:
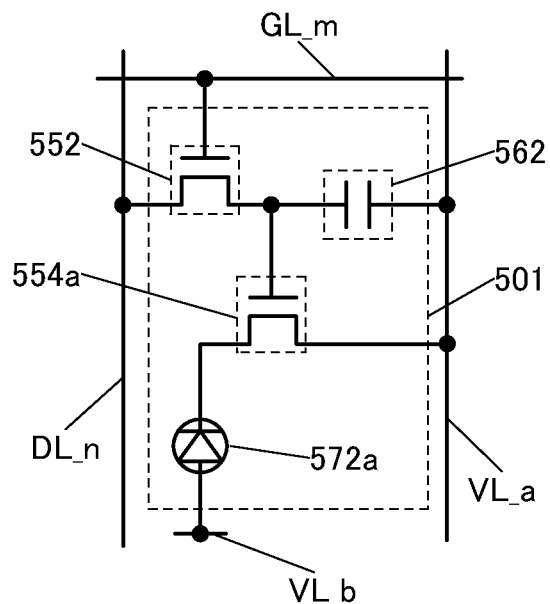
FIG. 21 (A), (B), (C) Circuit diagrams of a display device.

FIG. 21(A) shows an example in which an n-channel transistor is used as the transistor 554 in the pixel circuit 501 shown in FIG. 20(B). The pixel circuit 501 shown in FIG. 21(A) includes the transistor 552, a transistor 554a, the capacitor 562, and a light-emitting element 572a. The transistor 552 is an n-channel transistor, and the transistor 554a is an n-channel transistor. For example, the transistor described in the above embodiment, which includes an oxide semiconductor in a channel formation region, can be used as the transistor 552, and a transistor including silicon in a channel formation region can be used as the transistor 554a.

Alternatively, for example, the transistor described in the above embodiment, which includes an oxide semiconductor in a channel formation region, can be used as each of the transistor 552 and the transistor 554a. With such a structure, the area occupied by the transistors in pixels can be reduced, so that an extremely high-definition image can be displayed.

In the pixel circuit 501 shown in FIG. 21(A), one of a source and a drain of the transistor 552 is electrically connected to the data line DL_n. The other of the source and the drain of the transistor 552 is electrically connected to one electrode of the capacitor 562 and a gate of the transistor 554a. The other electrode of the capacitor 562 is electrically connected to the potential supply line VL_a. A gate of the transistor 552 is electrically connected to the scan line GL_m. One of a source and a drain of the transistor 554a is electrically connected to the potential supply line VL_a. The other of the source and the drain of the transistor 554a is electrically connected to one electrode of the light-emitting element 572a. The other electrode of the light-emitting element 572a is electrically connected to the potential supply line VL_b. The low power supply potential $V_{SS}$ is applied to the potential supply line VL_a, and the high power supply potential VDD is applied to the potential supply line VL_b.

Figure 21B:
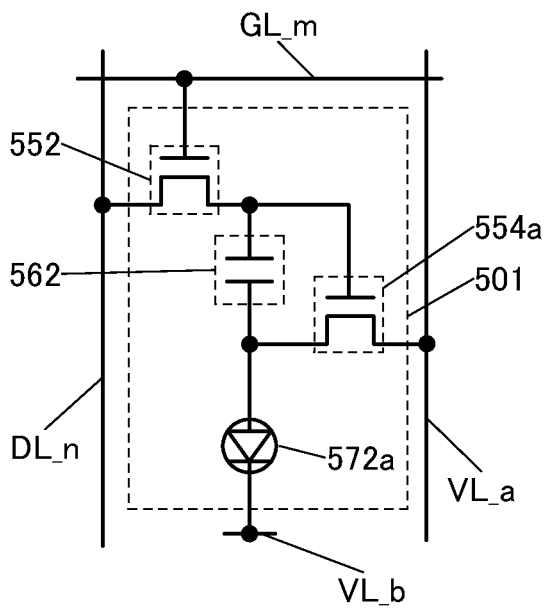

FIG. 21(B) shows a structure different from that of the pixel circuit 501 shown in FIG. 21(A). In the pixel circuit 501 shown in FIG. 21(B), the one of the source and the drain of the transistor 552 is electrically connected to the data line DL_n. The other of the source and the drain of the transistor 552 is electrically connected to the one electrode of the capacitor 562 and the gate of the transistor 554a. The gate of the transistor 552 is electrically connected to the scan line GL_m. The one of the source and the drain of the transistor 554a is electrically connected to the potential supply line VL_a. The other of the source and the drain of the transistor 554a is electrically connected to the other electrode of the capacitor 562 and the one electrode of the light-emitting element 572a. The other electrode of the light-emitting element 572a is electrically connected to the potential supply line VL_b. The high power supply potential VDD is applied to the potential supply line VL_a, and the low power supply potential $V_{SS}$ is applied to the potential supply line VL_b.

Figure 21C:
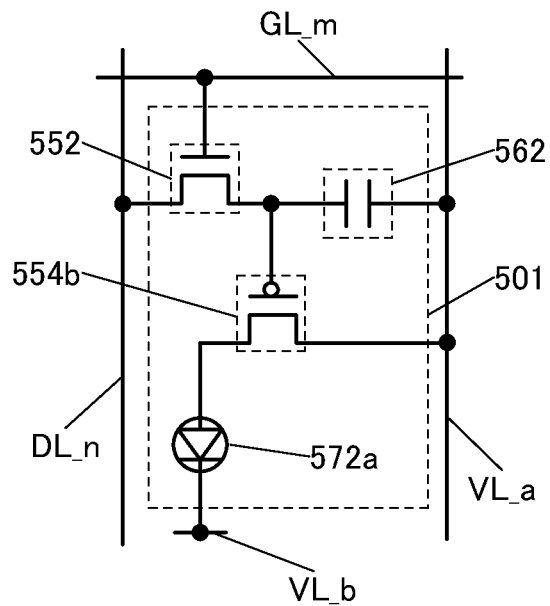

FIG. 21(C) shows an example in which a p-channel transistor is used as the transistor 554 in the pixel circuit 501 shown in FIG. 20(B). The pixel circuit 501 shown in FIG. 21(C) includes the transistor 552, a transistor 554b, the capacitor 562, and the light-emitting element 572a. The transistor 552 is an n-channel transistor, and the transistor 554b is an p-channel transistor. For example, the transistor described in the above embodiment, which includes an oxide semiconductor in a channel formation region, can be used as the transistor 552, and a transistor including silicon in a channel formation region can be used as the transistor 554b.

In the pixel circuit 501 shown in FIG. 21(C), one of a source and a drain of the transistor 552 is electrically connected to the data line DL_n. The other of the source and the drain of the transistor 552 is electrically connected to one electrode of the capacitor 562 and a gate of the transistor 554b. The other electrode of the capacitor 562 is electrically connected to the potential supply line VL_a. A gate of the transistor 552 is electrically connected to the scan line GL_m. One of a source and a drain of the transistor 554b is electrically connected to the potential supply line VL_a. The other of the source and the drain of the transistor 554a is electrically connected to one electrode of the light-emitting element 572a. The other electrode of the light-emitting element 572a is electrically connected to the potential supply line VL_b. The high power supply potential VDD is applied to the potential supply line VL_a, and the low power supply potential $V_{SS}$ is applied to the potential supply line VL_b.

At least part of this embodiment can be implemented in appropriate combination with the other embodiments described in this specification.

Embodiment 5

A pixel circuit including a memory for correcting gray levels displayed by pixels and a display device including the pixel circuit will be described. The transistor described in the above embodiment can be applied to transistors used in the pixel circuit illustrated below.

<Circuit Configuration>

Figure 22A:
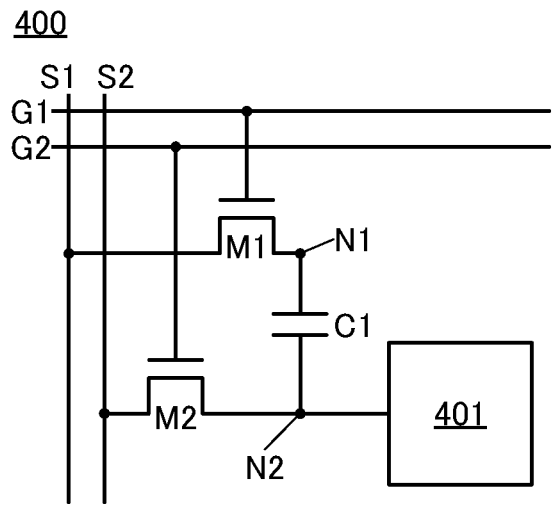
FIG. 22 (A), (C), (D) Circuit diagrams of display devices. (B) A timing chart for a display device.

FIG. 22(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. An LED element can be used as the display element.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is illustrated in the above embodiment, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Operation Method Example

Figure 22B:
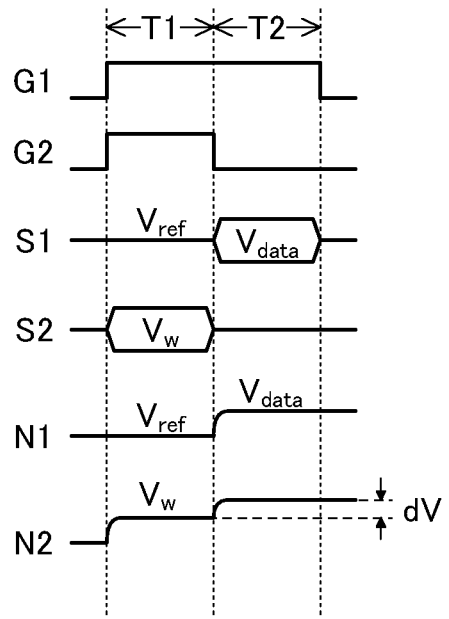

Next, an example of a method for operating the pixel circuit 400 is described with reference to FIG. 22(B). FIG. 22(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 22(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$–$V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 22(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. In the case of using a light-emitting element, high-dynamic range (HDR) display or the like can be performed.

Figure 22C:
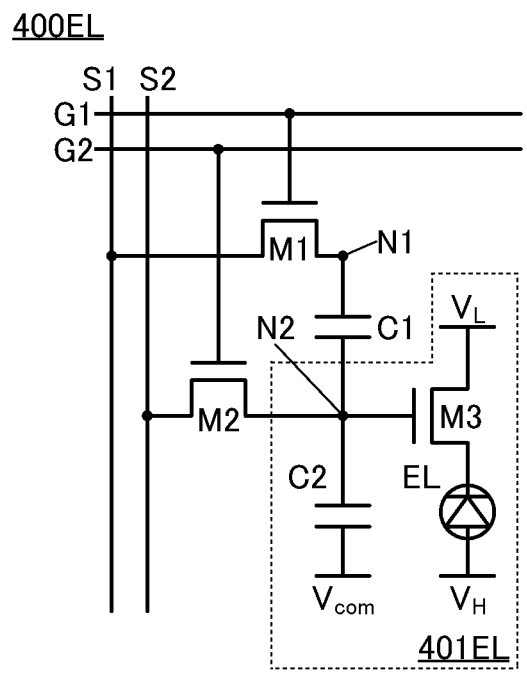

A pixel circuit 400EL shown FIG. 22(C) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_L$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_H$.

The transistor M3 has a function of controlling a current to be supplied to the light-emitting element EL. The capacitor C2 functions as a storage capacitor. The capacitor C2 can be omitted when not needed.

Figure 22D:
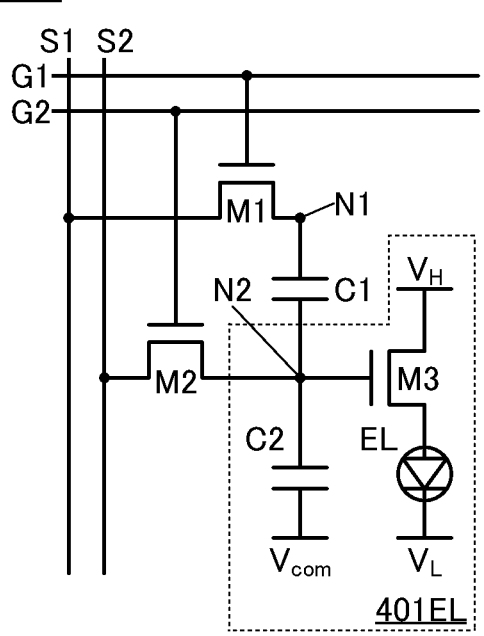

Note that although the structure in which the cathode side of the light-emitting element EL is connected to the transistor M3 is described here, the transistor M3 may be connected to the anode side as shown in FIG. 22(D). In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits illustrated in FIG. 22(C) and FIG. 22(D), and a configuration to which a transistor, a capacitor, or the like is further added may be employed.

At least part of this embodiment can be implemented in appropriate combination with the other embodiments described in this specification.

Embodiment 6

In this embodiment, structures of a data processing device of one embodiment of the present invention will be described with reference to FIG. 23 and FIG. 24.

FIG. 23 and FIG. 24 are views showing structures of the data processing device of one embodiment of the present invention. FIG. 23(A) is a block diagram of the data processing device, and FIG. 23(B) to FIG. 23(E) are perspective views showing structures of the data processing device. FIG. 24(A) to FIG. 24(E) are perspective views showing structures of the data processing device.

<Data Processing Device>

Figure 23A:
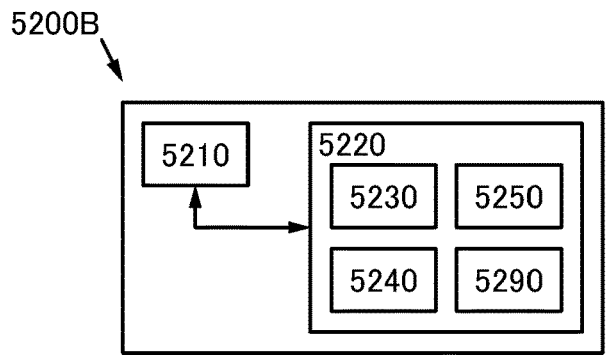
FIG. 23 (A), (B), (C), (D), (E) Diagrams illustrating data processing devices.

A data processing device 5200B described in this embodiment includes an arithmetic device 5210 and an input/output device 5220 (see FIG. 23(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display device described in the above embodiment can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

Structure Example 1 of Data Processing Device

Figure 23B:
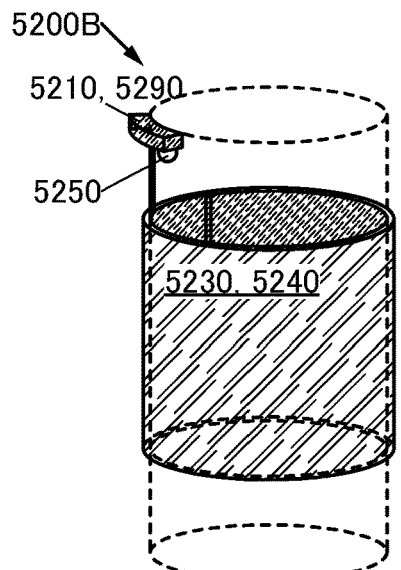

For example, the display portion 5230 can have an outer shape along a cylindrical column (see FIG. 23(B)). The data processing device 5200B has a function of changing its display method in accordance with the illuminance of a usage environment. In addition, the data processing device 5200B has a function of changing the displayed content in response to sensed existence of a person. This allows the data processing device 5200B to be provided on a column of a building, for example. The data processing device 5200B can display advertising, guidance, or the like. The data processing device 5200B can also be used for digital signage or the like.

Structure Example 2 of Data Processing Device

Figure 23C:
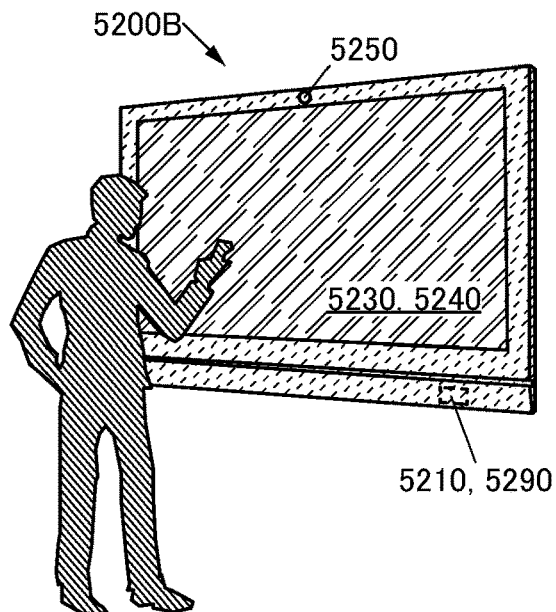

For example, the data processing device 5200B has a function of generating image data on the basis of the path of a pointer used by a user (see FIG. 23(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device 5200B can be used for an electronic blackboard, an electronic bulletin board, or digital signage, for example.

Structure Example 3 of Data Processing Device

Figure 23D:
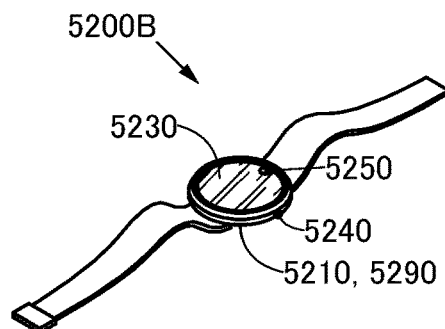

For example, the data processing device 5200B has a function of changing its display method in accordance with the illuminance of a usage environment (see FIG. 23(D)). Thus, for example, the power consumption of a smartwatch can be reduced. Alternatively, for example, a smartwatch can display an image so as to be suitably used even in an environment under strong external light, e.g., outdoors in fine weather.

Structure Example 4 of Data Processing Device

Figure 23E:
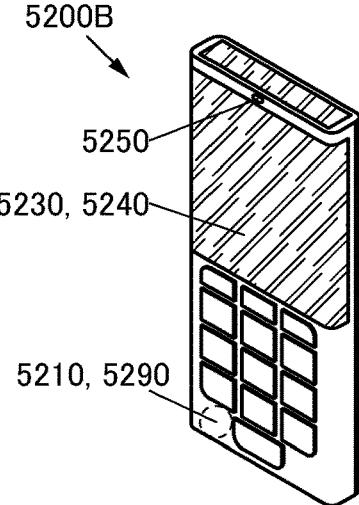

For example, the display portion 5230 has a surface gently curved along a side surface of a housing (see FIG. 23(E)). The display portion 5230 includes a display panel that can display an image on the front surface, the side surfaces, and the top surface, for example. Thus, for example, a mobile phone can display image data not only on its front surface but also on its side surfaces and top surface.

Structure Example 5 of Data Processing Device

Figure 24A:
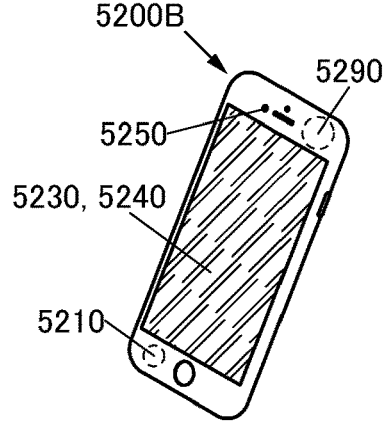
FIG. 24 (A), (B), (C), (D), (E) Diagrams illustrating data processing devices.

For example, the data processing device 5200B has a function of changing its display method in accordance with the illuminance of a usage environment (see FIG. 24(A)). Thus, the power consumption of a smartphone can be reduced. Alternatively, for example, a smartphone can display an image so as to be suitably used even in an environment under strong external light, e.g., outdoors in fine weather.

Structure Example 6 of Data Processing Device

Figure 24B:
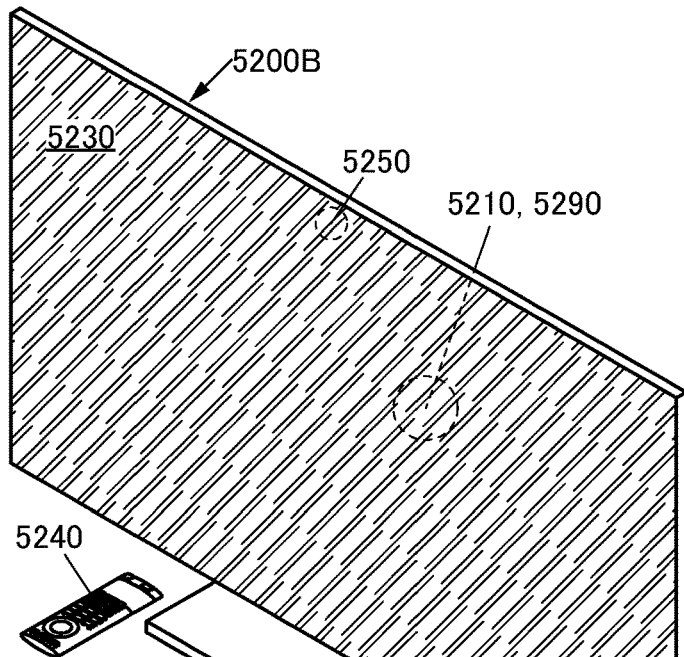

For example, the data processing device 5200B has a function of changing its display method in accordance with the illuminance of a usage environment (see FIG. 24(B)). Thus, for example, a television system can display an image in such a manner that the television system can be suitably used even when irradiated with strong external light that enters the room from the outside in fine weather.

Structure Example 7 of Data Processing Device

Figure 24C:
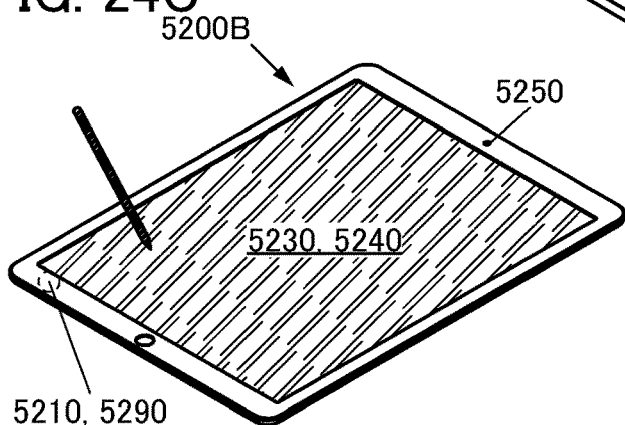

For example, the data processing device 5200B has a function of changing its display method in accordance with the illuminance of a usage environment (see FIG. 24(C)). Thus, for example, a tablet computer can display an image so as to be suitably used even in an environment under strong external light, e.g., outdoors in fine weather.

Structure Example 8 of Data Processing Device

Figure 24D:
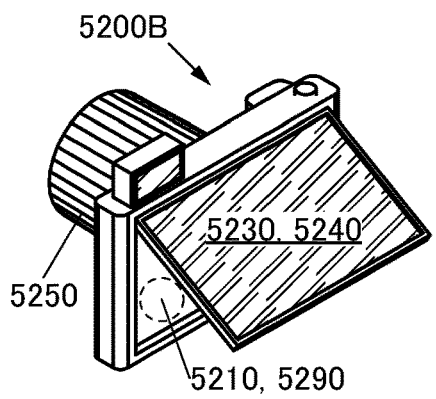

For example, the data processing device 5200B has a function of changing its display method in accordance with the illuminance of a usage environment (see FIG. 24(D)). Thus, for example, a digital camera can display a subject in such a manner that an image is favorably viewed even in an environment under strong external light, e.g., outdoors in fine weather.

Structure Example 9 of Data Processing Device

Figure 24E:
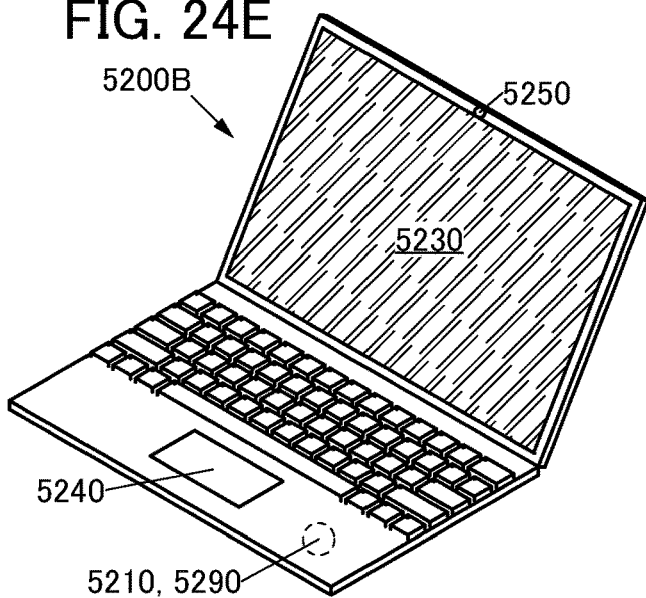

For example, the data processing device 5200B has a function of changing its display method in accordance with the illuminance of a usage environment (see FIG. 24(E)). Thus, for example, a personal computer can display an image so as to be suitably used even in an environment under strong external light, e.g., outdoors in fine weather.

At least part of this embodiment can be implemented in appropriate combination with the other embodiments described in this specification.

REFERENCE NUMERALS

10, 10A, 10B, 10C, 10D, 10E, 10F, 10G, 10H: display device, 11, 13: substrate, 15: functional layer, 17: light-emitting element, 20B: blue light, 20G: green light, 20R: red light, 21, 23: electrode, 25: insulating layer, 27: adhesive layer, 31, 33: light-blocking layer, 35: phosphor layer, 50: LED package, 51: LED chip

The invention claimed is:

1. A display device comprising:
a first wiring;
a second wiring;
a third wiring;
a first transistor;
a second transistor;
a third transistor;
a capacitor;
a light-emitting element;
a coloring layer;
a first electrode;
a second electrode;
a first bump; and
a second bump,
wherein the light-emitting element is electrically connected to the first electrode and the second electrode,
wherein the first electrode is electrically connected to one of a source and a drain of the first transistor,
wherein the first electrode overlaps with a gate of the first transistor,
wherein the second electrode is positioned on the same plane as the first electrode,
wherein the coloring layer is positioned over the light-emitting element,
wherein the coloring layer includes a region overlapping with the light-emitting element,
wherein the light-emitting element includes a light-emitting diode chip,
wherein the light-emitting element is configured to emit white light,
wherein the first bump is positioned between one electrode of the light-emitting element and the first electrode,
wherein the second bump is positioned between the other electrode of the light-emitting element and the second electrode,
wherein one of a source and a drain of the second transistor is electrically connected to one electrode of the capacitor,
wherein one of a source and a drain of the third transistor is electrically connected to the other electrode of the capacitor,
wherein the one of the source and the drain of the third transistor is directly connected to the gate of the first transistor,
wherein a gate of the second transistor is electrically connected to the first wiring,
wherein a gate of the third transistor is electrically connected to the second wiring, and
wherein the other one of the source and the drain of the second transistor is electrically connected to the third wiring.

2. The display device according to claim 1,
wherein the light-emitting element is configured to emit light toward the coloring layer.

3. The display device according to claim 1,
wherein at least one of the first transistor, the second transistor, and the third transistor includes an oxide semiconductor in a channel formation region.

4. The display device according to claim 1,
wherein at least one of the first transistor, the second transistor, and the third transistor includes silicon in a channel formation region.

5. The display device according to claim 1,
wherein the first bump and the second bump include silver, and
wherein the first electrode and the second electrode include at least one of silver, aluminum, titanium, and copper.

6. The display device according to claim 1, further comprising a second capacitor,
wherein one electrode of the second capacitor is electrically connected to the gate of the first transistor.

7. The display device according to claim 1, further comprising:
a first wiring;
a second wiring;

a third wiring; and a fourth wiring, wherein the other of source and drain of the second transistor is electrically connected to the first wiring, wherein the other of source and drain of the third transistor is electrically connected to the second wiring, wherein a gate of the second transistor is electrically connected to the third wiring, and wherein a gate of the third transistor is electrically connected to the fourth wiring.

8. A display device comprising:

a first wiring;

a second wiring;

a third wiring;

a first transistor;

a second transistor;

a third transistor;

a capacitor;

a light-emitting element;

a coloring layer;

a phosphor layer;

a first electrode;

a second electrode;

a first bump; and a second bump, wherein the light-emitting element is electrically connected to the first electrode and the second electrode, wherein the first electrode is electrically connected to one of a source and a drain of the first transistor, wherein the first electrode overlaps with a gate of the first transistor, wherein the second electrode is positioned on the same plane as the first electrode, wherein the coloring layer is positioned over the light-emitting element, wherein the phosphor layer is positioned between the light-emitting element and the coloring layer, wherein the phosphor layer, the light-emitting element, and the coloring layer include a region in which they overlap with one another, wherein the light-emitting element includes a light-emitting diode chip, wherein the phosphor layer includes a phosphor emitting light of a complementary color of an emission color of the light-emitting element, wherein the first bump is positioned between one electrode of the light-emitting element and the first electrode, wherein the second bump is positioned between the other electrode of the light-emitting element and the second electrode, wherein one of a source and a drain of the second transistor is electrically connected to one electrode of the capacitor, wherein one of a source and a drain of the third transistor is electrically connected to the other electrode of the capacitor, wherein the one of the source and the drain of the third transistor is directly connected to the gate of the first transistor, wherein a gate of the second transistor is electrically connected to the first wiring, wherein a gate of the third transistor is electrically connected to the second wiring, and wherein the other one of the source and the drain of the second transistor is electrically connected to the third wiring.

9. The display device according to claim 8, further comprising a light-blocking layer, wherein the light-blocking layer is adjacent to the light-emitting element.

10. The display device according to claim 8, wherein the light-emitting element is configured to emit blue light, and wherein the phosphor layer includes a phosphor emitting yellow light.

11. The display device according to claim 8, wherein the light-emitting element is configured to emit near-ultraviolet light or violet light, and wherein the phosphor layer includes a phosphor emitting red light, a phosphor emitting green light, and a phosphor emitting blue light.

12. The display device according to claim 8, wherein the light-emitting element is configured to emit light toward the coloring layer.

13. The display device according to claim 8, wherein at least one of the first transistor, the second transistor, and the third transistor includes an oxide semiconductor in a channel formation region.

14. The display device according to claim 8, wherein at least one of the first transistor, the second transistor, and the third transistor includes silicon in a channel formation region.

15. The display device according to claim 8, wherein the first bump and the second bump include silver, and wherein the first electrode and the second electrode include at least one of silver, aluminum, titanium, and copper.

16. The display device according to claim 8, further comprising a second capacitor, wherein one electrode of the second capacitor is electrically connected to the gate of the first transistor.

17. The display device according to claim 8, further comprising:

a first wiring;

a second wiring;

a third wiring; and a fourth wiring, wherein the other of source and drain of the second transistor is electrically connected to the first wiring, wherein the other of source and drain of the third transistor is electrically connected to the second wiring, wherein a gate of the second transistor is electrically connected to the third wiring, and wherein a gate of the third transistor is electrically connected to the fourth wiring.

* * * * *